US012784784B2

(12) United States Patent
Yang

(10) Patent No.: US 12,784,784 B2
(45) Date of Patent: Nov. 3, 2026

(54) METHOD FOR ADAPTIVE NOISE SUPPRESSION ON DATA STROBE SIGNALS AND MEMORY DEVICE USING THE SAME

(71) Applicant: NANYA TECHNOLOGY CORPORATION, New Taipei City (TW)

(72) Inventor: Wu-Der Yang, Taoyuan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 111 days.

(21) Appl. No.: 18/796,387

(22) Filed: Aug. 7, 2024

(65) Prior Publication Data

US 2025/0218472 A1 Jul. 3, 2025

Related U.S. Application Data

(62) Division of application No. 18/402,797, filed on Jan. 3, 2024, now Pat. No. 12,469,524.

(51) Int. Cl.
*G11C 7/02* (2006.01)
*G11C 7/08* (2006.01)
(Continued)

(52) U.S. Cl.
CPC .................. *G11C 7/02* (2013.01); *G11C 7/08* (2013.01); *G11C 7/10* (2013.01); *G11C 7/1084* (2013.01);
(Continued)

(58) Field of Classification Search
CPC .... G11C 7/02; G11C 7/08; G11C 7/10; G11C 7/1084; G11C 7/109; G11C 7/1093;
(Continued)

(56) References Cited

U.S. PATENT DOCUMENTS 8,756,364 B1 6/2014 Bhakta et al.
9,583,176 B1 2/2017 Mozak
(Continued)

OTHER PUBLICATIONS

Office Action and and the search report mailed on Jul. 30, 2025 related to U.S. Appl. No. 18/402,797, wherein this application is a Div of U.S. Appl. No. 18/402,797.
(Continued)

*Primary Examiner* — Amir Zarabian
*Assistant Examiner* — Justin Bryce Heisterkamp
(74) *Attorney, Agent, or Firm* — Xuan Zhang

(57) ABSTRACT

A method for adaptive noise suppression on data strobe signals is provided. The method includes the following steps: determining whether a first data strobe signal and a second data strobe signal satisfy a first condition; in response to the first data strobe signal and the second data strobe signal satisfying the first condition, determining whether a mode register setting value (MRSV) associated with a first on-die terminator and a second on-die terminator is greater than N; and in response to the MRSV being not greater than N, decoupling a first resistor and a second resistor from a first input terminal and a second input terminal of a differential amplifier, respectively; and in response to the MRSV being greater than N, coupling the first resistor and the second resistor to the first input terminal and the second input terminal of the differential amplifier, respectively.

3 Claims, 22 Drawing Sheets

(51) Int. Cl.
*G11C 7/10* (2006.01)
*G11C 7/22* (2006.01)

(52) U.S. Cl.
CPC ............ *G11C 7/109* (2013.01); *G11C 7/1093* (2013.01); *G11C 7/222* (2013.01)

(58) Field of Classification Search
CPC ........... G11C 7/222; G11C 7/065; G11C 7/22; G11C 7/1078; H03F 1/30; H03F 3/45; H03H 21/0001
See application file for complete search history.

(56) References Cited

U.S. PATENT DOCUMENTS

| | | | | |
|---|---|---|---|---|
| 10,366,041 | B2 | 7/2019 | Kuehlwein et al. | |
| 10,657,009 | B2 | 5/2020 | Mutnury et al. | |
| 2010/0039875 | A1 | 2/2010 | Stott et al. | |
| 2013/0010546 | A1 | 1/2013 | Wang et al. | |
| 2013/0082761 | A1 | 4/2013 | Dono et al. | |
| 2013/0290766 | A1 | 10/2013 | Nguyen et al. | |
| 2014/0002131 | A1 * | 1/2014 | Shaeffer | G11C 7/1084 326/30 |
| 2015/0124539 | A1 | 5/2015 | Lijima | |
| 2018/0322914 | A1 | 11/2018 | Wu et al. | |
| 2020/0027498 | A1 * | 1/2020 | Jeon | H03K 19/0005 |
| 2021/0151091 | A1 * | 5/2021 | Jeon | G11C 11/4093 |
| 2022/0358994 | A1 * | 11/2022 | Song | H03K 19/0005 |
| 2023/0070380 | A1 | 3/2023 | Yamamoto | |
| 2023/0126654 | A1 | 4/2023 | Yu et al. | |
| 2023/0386532 | A1 * | 11/2023 | Yoon | G11C 7/1057 |

OTHER PUBLICATIONS

Office Action and and the search report mailed on Jul. 30, 2025 related to U.S. Appl. No. 18/413,488.

Office Action and and the search report mailed on Sep. 15, 2025 related to U.S. Appl. No. 18/413,488.

* cited by examiner

METHOD FOR ADAPTIVE NOISE SUPPRESSION ON DATA STROBE SIGNALS AND MEMORY DEVICE USING THE SAME

CROSS-REFERENCE TO RELATED APPLICATION

This application is a divisional application of U.S. Non-Provisional application Ser. No. 18/402,797 filed Jan. 3, 2024, which is incorporated herein by reference in its entirety.

TECHNICAL FIELD

The present disclosure relates to electronic circuits, and more particularly, to a method for adaptive noise suppression on data strobe signals and a memory device using the same.

DISCUSSION OF THE BACKGROUND

An LPDDR4 (Low-power Double Data Rate 4) memory is the mobile equivalent of a DDR4 (Double Data Rate 4) memory. A memory controller can control data access of an LPDDR4 memory via command control signals, data signals, and data strobe signals. However, when a write data strobe (WDQS) function of the memory controller is turned off, the logic states of the data strobe signals from the memory controller may be affected by the noises thereon since the noises are amplified by the differential amplifier in the receiver circuit of the LPDDR4 memory, leading to malfunctions or failures of the control circuit of the LPDDR4 memory. Accordingly, there is a demand for a method for adaptive noise suppression on data strobe signals and a memory device using the same to solve the aforementioned problem.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a memory device. The memory device includes a memory cell array, a control circuit, and a receiver circuit. The control circuit is configured to control data access of the memory cell array. The receiver circuit is configured to receive a first data strobe signal and a second data strobe signal from a memory controller. The receiver circuit includes a differential amplifier, a first on-die terminator, a second on-die terminator, a noise-suppression control circuit, a first noise-suppression circuit, and a second noise-suppression circuit. The differential amplifier is configured to amplify the first data strobe signal and the second data strobe signal to generate a third data strobe signal and a fourth data strobe signal. The first on-die terminator is coupled to a first input terminal of the differential amplifier. The second on-die terminator is coupled to a second input terminal of the differential amplifier. The noise-suppression control circuit is configured to generate a noise-suppression control signal based on a mode register setting value corresponding to the first on-die terminator and the second on-die terminator. The first noise-suppression circuit is configured to selectively couple a first resistor to the first input terminal of the differential amplifier according to the third data strobe signal, the fourth data strobe signal, and the noise-suppression control signal. The second noise-suppression circuit is configured to selectively couple a second resistor to the second input terminal of the differential amplifier according to the third data strobe signal, the fourth data strobe signal, and the noise-suppression control signal.

Another aspect of the present disclosure provides a memory device. The memory device includes a memory cell array, a control circuit, and an interface circuit. The control circuit is configured to control data access of the memory cell array. The receiver circuit is configured to amplify the first data strobe signal and the second data strobe signal to generate a third data strobe signal and a fourth data strobe signal. In response to the first data strobe signal and the second data strobe signal satisfying a predetermined condition, the receiver circuit is further configured to selectively couple a first resistor and a second resistor to the first data strobe signal and the second data strobe signal for noise suppression based on a mode register setting value, respectively.

Yet another aspect of the present disclosure provides a method for adaptive noise suppression for use in a memory device. The memory device includes a receiver circuit includes a differential amplifier, a first on-die terminator, a second on-die terminator. The method includes the following steps: determining whether a first data strobe signal and a second data strobe signal from a memory controller satisfy a first condition; in response to the first data strobe signal and the second data strobe signal satisfying the first condition, determining whether a mode register setting value associated with the first on-die terminator and the second on-die terminator is greater than N, wherein N is a positive integer; and in response to the mode register setting value being not greater than N, decoupling a first resistor and a second resistor from a first input terminal and a second input terminal of the differential amplifier, respectively; and in response to the mode register setting value being greater than N, coupling the first resistor and the second resistor to the first input terminal and the second input terminal in of the differential amplifier, respectively.

The foregoing outlines rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
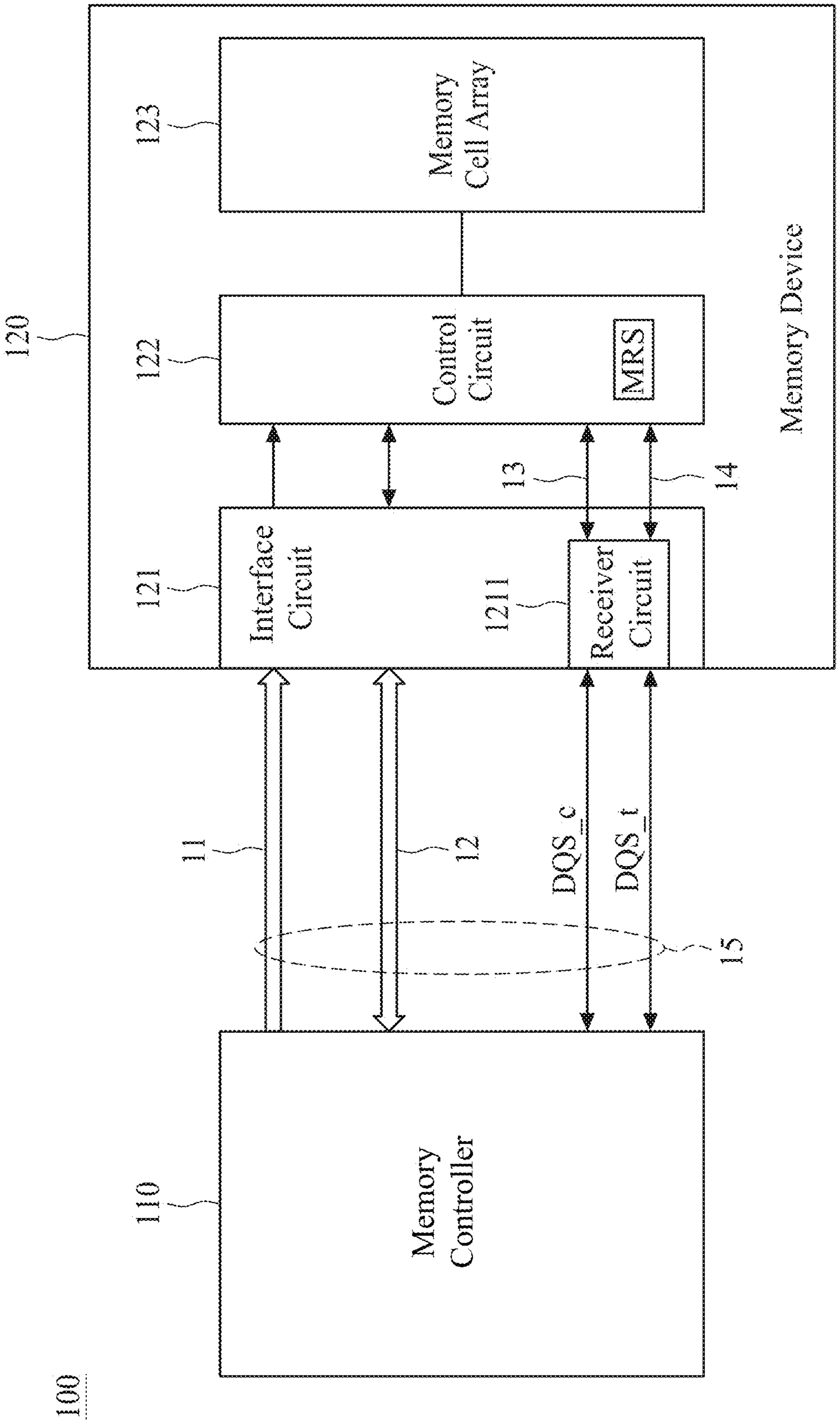
FIG. 1 is a block diagram of an electronic device in accordance with an embodiment of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (for example, rotated 90° or at other orientations) and the spatially relative descriptors used herein interpreted accordingly. In addition, it will also be understood that when a layer is referred to as being "between" two layers, it can be the only layer between the two layers, or one or more intervening layers may also be present.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

It will be understood that when an element or layer is referred to as being "formed on," another element or layer, it can be directly or indirectly formed on the other element or layer. That is, for example, intervening elements or layers may be present. In contrast, when an element or layer is referred to as being "directly formed on," to another element, there are no intervening elements or layers present. Other words used to describe the relationship between elements or layers should be interpreted in a like fashion (e.g., "between," versus "directly between," "adjacent," versus "directly adjacent," etc.).

FIG. 1 is a block diagram of an electronic device 100 in accordance with an embodiment of the present disclosure.

In some embodiments, the electronic device 100 may include a memory controller 110 and a memory device 120, as depicted in FIG. 1. The memory controller 110 may be implemented by a central processing unit (CPU), a microprocessor, a digital signal processor, a field-programmable gate arrays (FPGA), an application-specific integrated circuit (ASIC), or a radio-frequency integrated circuit (RFIC).

In some embodiments, the memory device 120 may be a dynamic random access memory (DRAM). In other embodiments, other types of memories can be used. For purposes of description, this disclosure may focus on double-date rate synchronous dynamic random access memory (DDR SDRAM) such as LPDDR4, but the scope of embodiments is not limited to any particular memory technology or standard.

In some embodiments, the memory device 120 may include an interface circuit 121, a control circuit 122, and a memory cell array 123. The interface circuit 121 may be configured to transmit and receive data signals 12 over bus 15, and to receive command control signals 11 and data strobe signals DQS_c and DQS_t from the memory controller 110 over bus 15. In other words, the interface circuit 121 may include TX circuits (not explicitly shown) for the data signals 12, and RX circuits (not explicitly shown) for the command control signals 11, data signals 12, and data strobe signals DQS_c and DQS_t.

In some embodiments, the data strobe signal DQS_c may be a complementary signal of the data strobe signal DQS_t. For example, when the data strobe signal DQS_t is in the high logic state (e.g., 1), the data strobe signal DQS_c is in the low logic state (e.g., 0). When the data strobe signal DQS_t is in the low logic state (e.g., 0), the data strobe signal DQS_c is in the high logic state (e.g., 1). In some embodiments, the logic states of the data strobe signals DQS_t and DQS_c may be the same if a write data strobe (WDQS) function of the memory controller 110 is not enabled or not properly implemented.

In some embodiments, the RX circuits for the data strobe signals DQS_c and DQS_t can be referred to as a receiver circuit 1211 shown in FIG. 1. The receiver circuit 1211 may be configured to correct the data strobe signals DQS_c and DQS_t with inappropriate logic states and/or timing to generate data strobe signals 13 and 14. The data strobe signals 13 and 14 may be data strobe signals (e.g., *DQS_c and *DQS_t) with corrected logic states complying with the LPDDR4 standard defined by JEDEC Solid State Technology Association (i.e., abbreviated as JEDEC).

In some embodiments, the control circuit 122 may perform a read operation or a write operation according to the command control signals 11 and the data strobe signals 13 and 14. For example, during a write operation, the memory device 120 may receive a write command (e.g., including command control signal 11 and data signals 12) from the memory controller 110 over bus 15, and the control circuit 122 may then store the received data in the memory cell array 123. During a read operation, the memory device 120 may receive a read command signal (e.g., command control signal 11) from the memory controller 110 over bus 15, and the control circuit 122 may then access the data from various memory cells of the memory cell array 123, and transmit those bits of data (e.g., data signals 12) to the memory controller 110 over bus 15.

Figure 2:
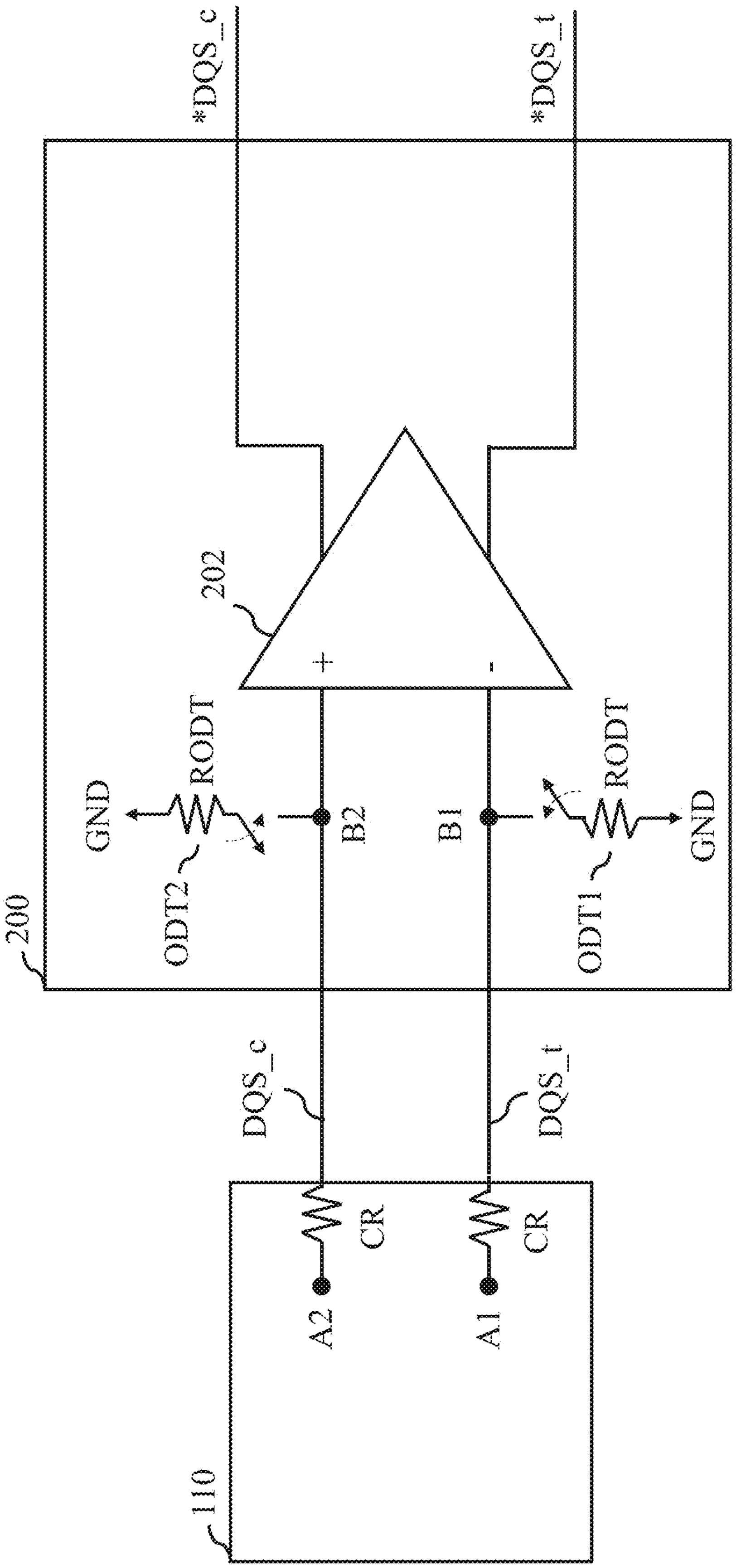
FIG. 2 is a schematic diagram of a receiver circuit in accordance with an embodiment of the present disclosure.

FIG. 2 is a schematic diagram of a receiver circuit 200 in accordance with an embodiment of the present disclosure. FIGS. 3A-3E are waveform diagrams of the data strobe signals during a write operation in accordance with an embodiment of the present disclosure. Please refer to FIG. 1, FIG. 2, and FIGS. 3A-3E.

In some embodiments, the receiver circuit 1211 shown in FIG. 1 can be implemented using the receiver circuit 200 shown in FIG. 2. The receiver circuit 200 may include a differential amplifier 202 configured to amplify the data strobe signals DQS_c and DQS_t to generate the data strobe signal *DQS_c and *DQS_t. In addition, the negative input terminal and the positive input terminal of the differential amplifier 202 may be coupled to on-die terminators ODT1 and ODT2, respectively. The on-die terminators ODT1 and ODT2 may be configured to suppress the noises on the received data strobe signals DQS_c and DQS_t. Moreover, the memory controller 110 may transmit the data strobe signals DQS_t and DQS_c to nodes B1 and B2 of the receiver circuit 200 from ports A1 and A2 through a respective output resistances (or characteristic resistance) CR. In some embodiments, the respective output resistances CR of ports A1 and A2 of the memory controller 110 may be approximately 50 ohms, but the present disclosure is not limited thereto.

For example, the receiver circuit 200 may respectively receive the data strobe signals DQS_c and DQS_t at its positive input terminal (e.g., +) and a negative input terminal (e.g., −) to generate the data strobe signal *DQS_c and *DQS_t. In some embodiments, the amplitude of the data strobe signals DQS_c and DQS_t may be between 50 mv and 100 mv which may not have a sufficient voltage level (e.g., 0.6V or 1.1V for an LPDDR4 DRAM) for the control circuit 122 to perform a write operation or a read operation. The amplitude of the data strobe signal *DQS_c and *DQS_t may be approximately 0.6V or 1.1V, and the control circuit 122 can perform a write operation or a read operation according to the command control signals 11 and the data strobe signal *DQS_c and *DQS_t.

In some embodiments, given that the memory device 120 is an LPDDR4 DRAM and the memory controller 110 follows the LPDDR4 standard (e.g., the write data strobe (WDQS) function is turned on), when the memory controller 110 issues a write command to the memory device 120, the data strobe signals DQS_t and DQS_c should be respectively kept at the low logic state and the high logic state prior to a write preamble being issued to the memory device 120 by the memory controller 110 at time t0. The duration tWPRE of the write preamble may last two clock cycles (e.g., from time t0 to time t4) till the data (e.g., data signals 12) being received by the control circuit 122 at time t4, and the data strobe signals DQS_t and DQS_c may vary in the duration tWPRE of the write preamble, as shown in FIG. 3A.

However, in some cases, the WDQS function of the memory controller 110 may not be turned on or properly implemented, resulting in uncertain logic states of the data strobe signals DQS_t and DQS_c for a duration (e.g., the time interval from time t(n−4) to time t0) prior to the write preamble being received by the control circuit 122 at time t0.

Figure 3A:
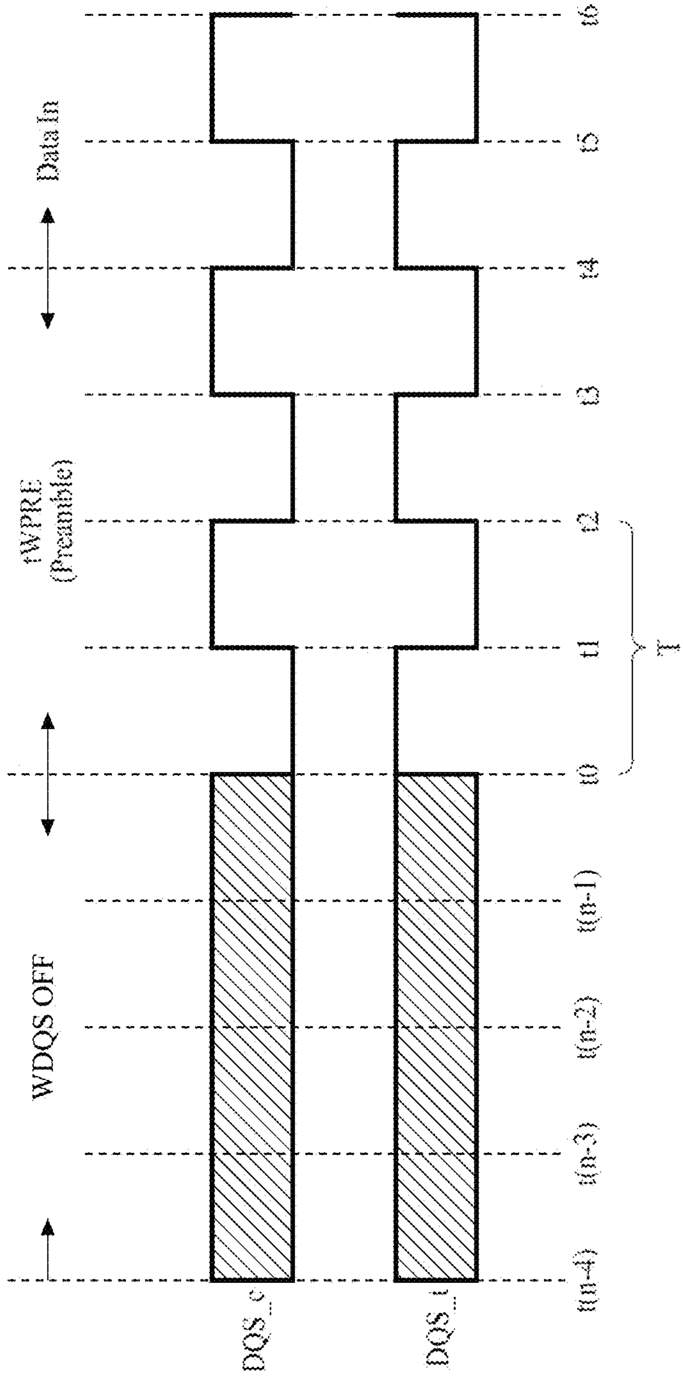
FIGS. 3A-3F are waveform diagrams of the data strobe signals during a write operation in accordance with an embodiment of the present disclosure.

For example, as depicted in FIG. 3A, the time interval between every two adjacent time points from t(n−4) to t6 may be half a clock cycle T/2. In other words, two time intervals (e.g., from t0 to t2) may constitute a clock cycle T.

At time t0, the write preamble tWPRE is issued by the memory controller 110. If the WDQS function is turned off, the logic states of the data strobe signals DQS_t and DQS_c may be uncertain for a duration (e.g., from time t(n−4) to time t0) prior to the write preamble tWPRE being issued at time t0, as shown in FIG. 3A. This situation can cause failure of the control circuit 122 during a write operation.

Figure 3B:
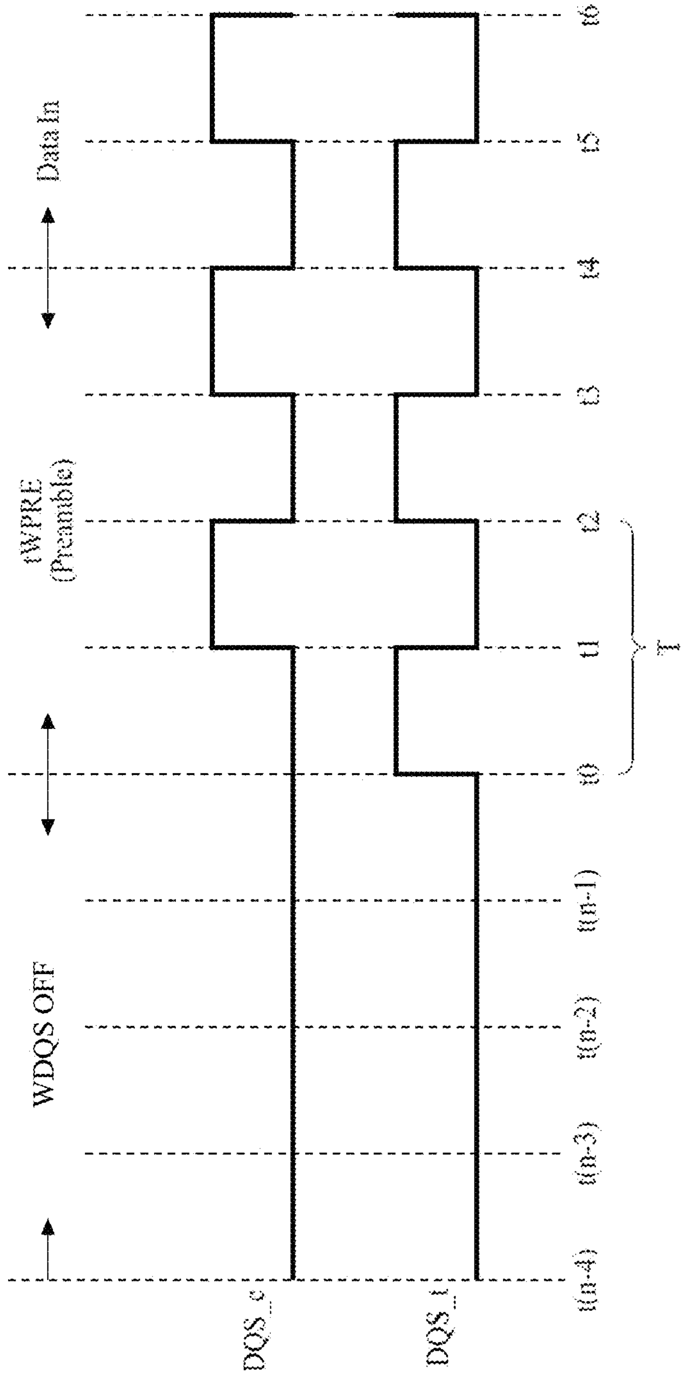

More specifically, there are four conditions of the logic states of the data strobe signals DQS_t and DQS_c for a duration prior to time t0. In the first condition, the WDQS function of the memory controller 110 may be not enabled, and the data strobe signals DQS_t and DQS_c kept at the low logic state for a duration prior to the write preamble being received by the control circuit 122 at time t0, as shown in FIG. 3B. The first condition can cause failure of the control circuit 122 during a write operation since the first condition does not comply with the requirement of a write operation of the LPDDR4 standard defined by the JEDEC.

Figure 3C:
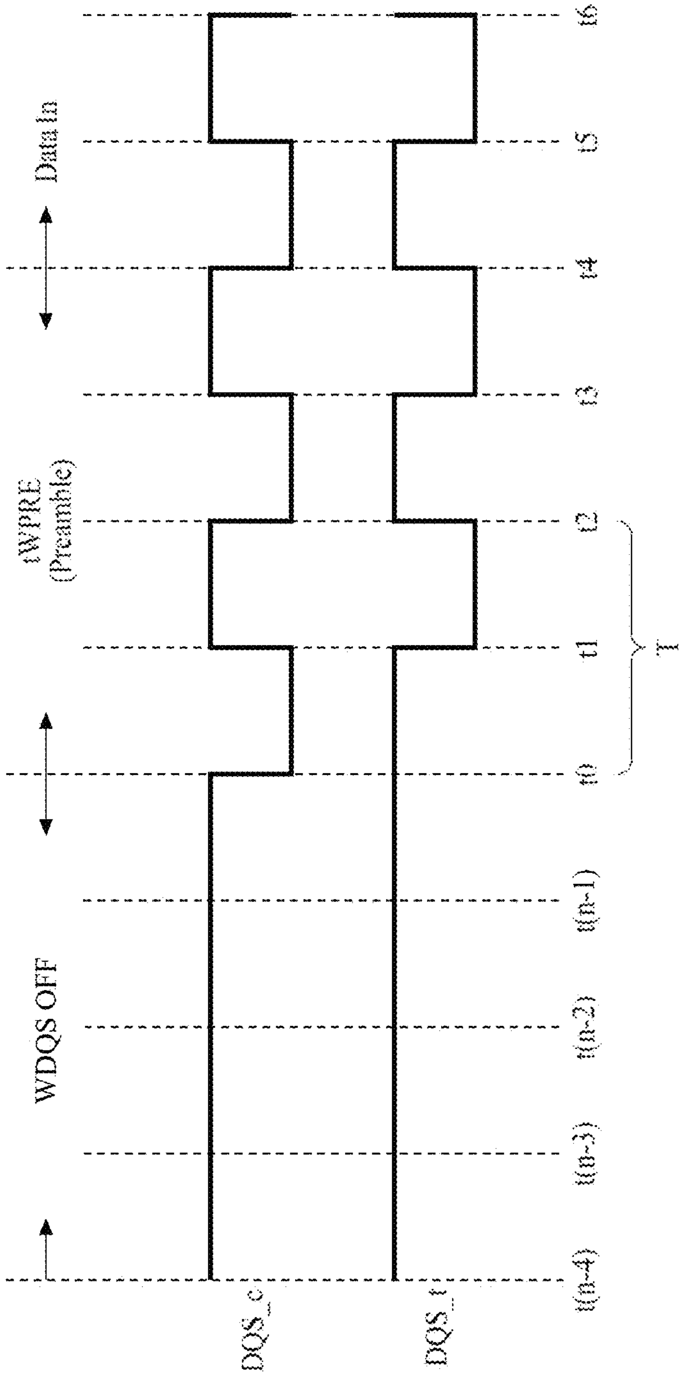

In the second condition, the WDQS function of the memory controller 110 may be not enabled, and the data strobe signals DQS_t and DQS_c kept at the high logic state for a duration prior to the write preamble being received by the control circuit 122 at time t0, as shown in FIG. 3C. The second condition can cause failure of the control circuit 122 during a write operation since the second condition does not comply with the requirement of a write operation of the LPDDR4 standard defined by the JEDEC.

Figure 3D:
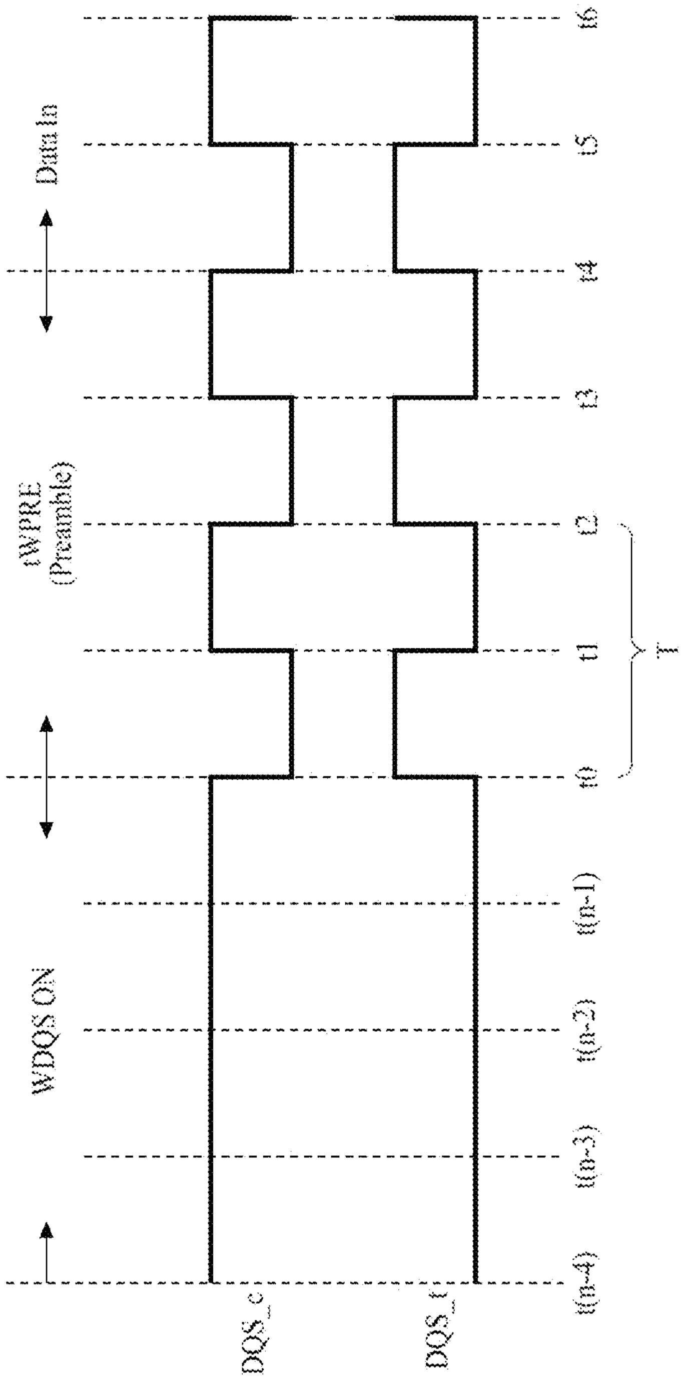

In the third condition, the WDQS function of the memory controller 110 may be enabled, and the data strobe signals DQS_t and DQS_c respectively kept at the low logic state and the high logic state for a duration prior to the write preamble being received by the control circuit 122 at time t0, as shown in FIG. 3D. The third condition will not cause failure of the control circuit 122 during a write operation since the third condition complies with the requirement of a write operation of the LPDDR4 standard defined by the JEDEC.

Figure 3E:
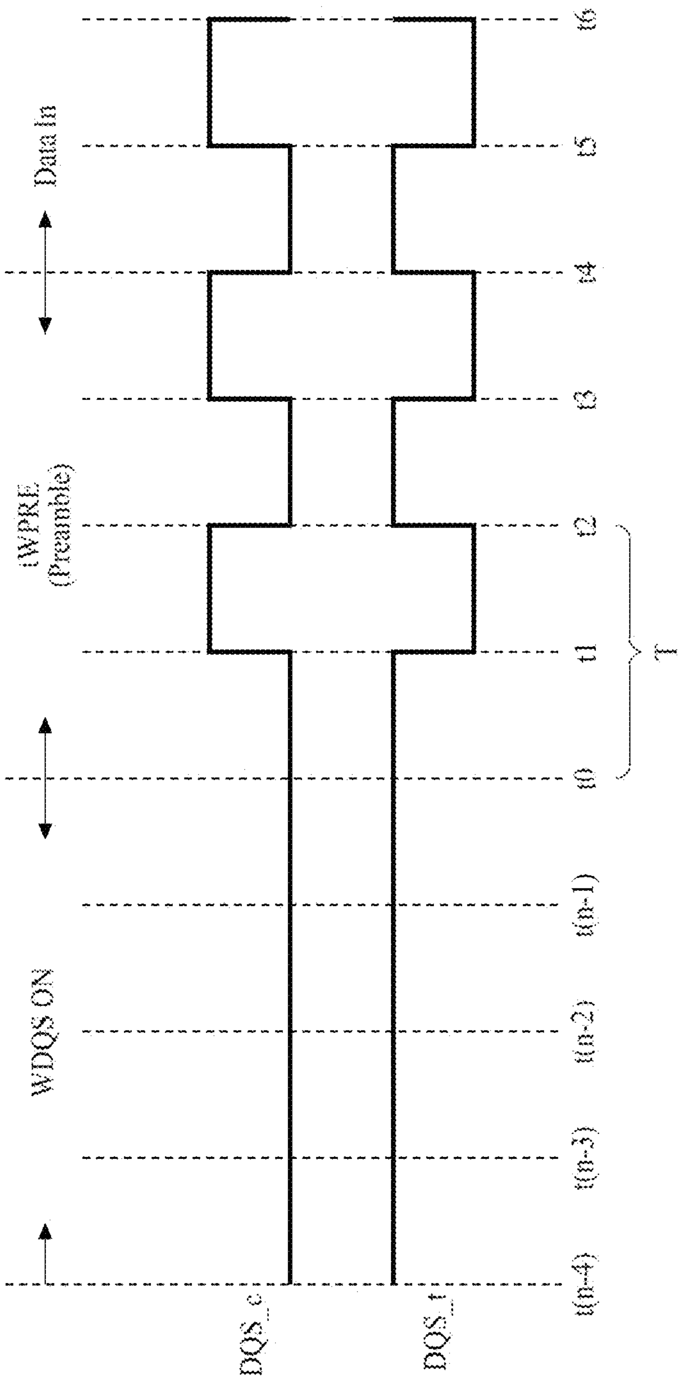

In the fourth condition, the WDQS function of the memory controller 110 may be enabled, and the data strobe signals DQS_t and DQS_c respectively kept at the high logic state and the low logic state for a duration prior to the write preamble being received by the control circuit 122 at time t0, as shown in FIG. 3E. The fourth condition will also not cause failure of the control circuit 122 during a write operation since the fourth condition complies with the LPDDR4 standard defined by the JEDEC.

Reference is now made to FIG. 2 again. In some embodiments, the resistances of the on-die terminators ODT1 and ODT2 may vary between a plurality of preset resistances, which may include 40 ohms, 60 ohms, 80 ohms, 120 ohms, 240 ohms, and an open-circuit resistance, and they depend on the setting value of the corresponding mode register (e.g., a register in the mode register set MRS of the control circuit 122 in FIG. 1) in the memory device 120 set by the memory controller 110. In some embodiments, when the mode register setting value (MRSV) corresponding to the on-die terminators ODT1 and ODT2 is set to 0, the on-die terminators ODT1 and ODT2 may be turned off to function as open circuits (e.g., resistance=∞). When the mode register setting value corresponding to the on-die terminators ODT1 and ODT2 is set to 1, 2, 3, 4, and 5, the resistances of the on-die terminators ODT1 and ODT2 may be 40 ohms, 60 ohms, 80 ohms, 120 ohms, 240 ohms, respectively, but the present disclosure is not limited thereto.

In some embodiments, when the WDQS function is turned off, the memory controller 110 may likely set the mode register corresponding to the on-die terminators ODT1 and ODT2 to a specific value (e.g., 0) so that the on-die terminators ODT1 and ODT2 are turned off to act as open circuits. In this situation, the amplitude of the noises received by the receiver circuit 1211 will not be suppressed. The differential amplifier 202 depicted in FIG. 2 amplifies the data strobe signals DQS_t and DQS_c as well as the noises on the data strobe signals DQS_t and DQS_c. In some embodiments, the amplitude of the data strobe signals DQS_t and DQS_c may be approximately between 300 mV and 600 mV, and the amplitude of the noises on the data strobe signals DQS_t and DQS_c may be approximately between 80 mV to 170 mV.

When the data strobe signals DQS_t and DQS_c are in the low logic state and the WDQS function is turned off, the amplified noises may reach similar amplitudes as the data strobe signals DQS_t and DQS_c in the high logic state. Accordingly, the amplified noises will be more probable to cause the data strobe signals DQS_t and DQS_c to change from the low logic state to the high logic state, potentially leading to misoperation or failure of the control circuit 122.

Figure 3F:
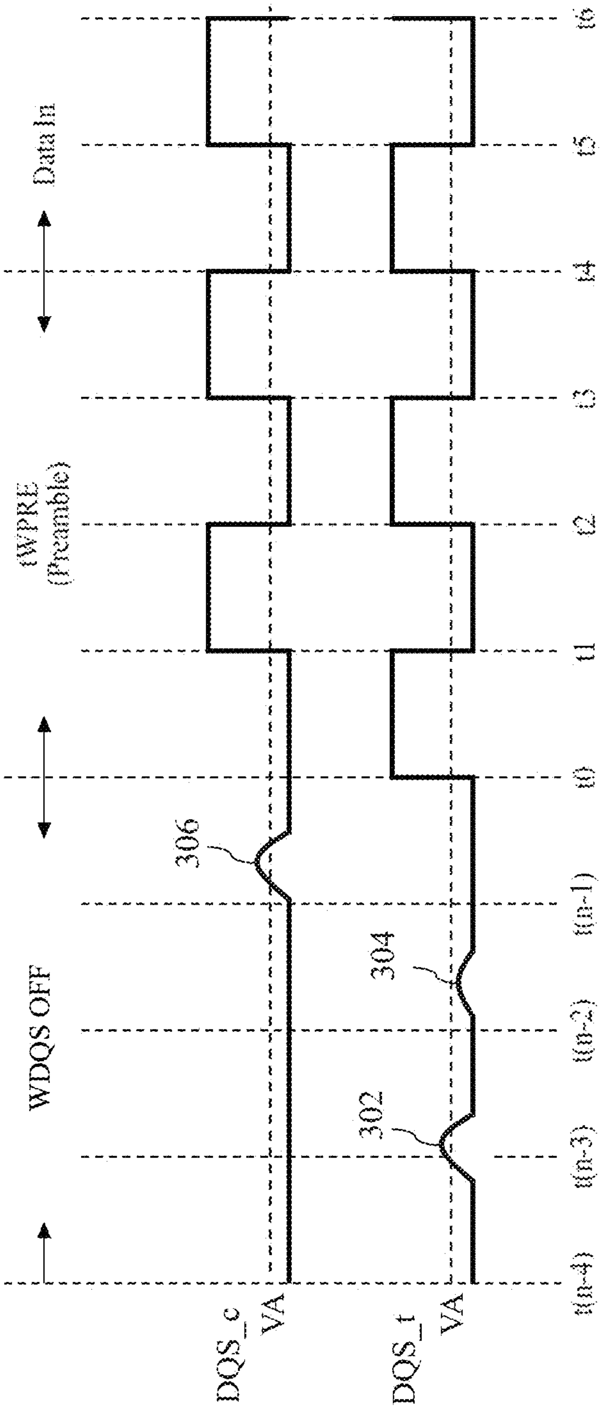

Referring to FIG. 3F, noises 302 and 304 are on the data strobe signal DQS_t, and a noise 306 is on the data strobe signal DQS_c. The noises 302 and 306 may have amplitudes higher than a particular voltage VA (e.g., approximately 90 mV), and the noise 304 may have an amplitude lower than the particular voltage VA. More specifically, when the amplitude of a noise on the data strobe signal DQS_t or DQS_c is higher than the particular voltage VA (e.g., noises 302 and 306), the amplified noise will cause the data strobe signals DQS_t and DQS_c to change from the low logic state to the high logic state, potentially leading to malfunctions or failures of the control circuit 122. The receiver circuit 400 shown in FIG. 4 provides a solution to this issue, the details of which will be discussed further.

Figure 4:
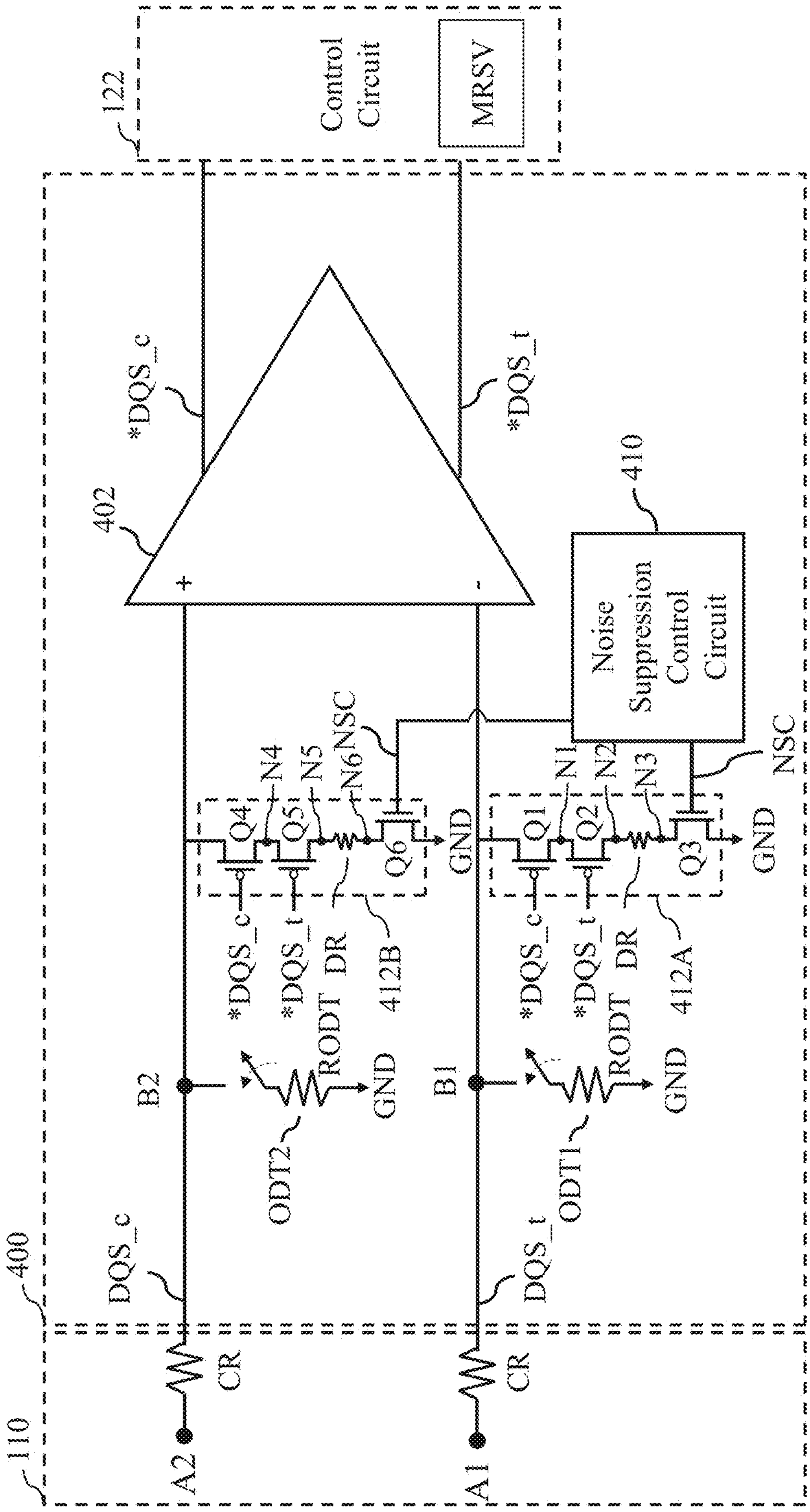
FIG. 4 is a diagram of a receiver circuit in accordance with another embodiment of the present disclosure.

FIG. 4 is a schematic diagram of a receiver circuit 400 in accordance with another embodiment of the present disclosure.

In some embodiments, the receiver circuit 1211 shown in FIG. 1 can be implemented using the receiver circuit 400 shown in FIG. 4. The receiver circuit 400 may include a differential amplifier 402, a noise-suppression control circuit 410, on-die terminators ODT1 and ODT2, and noise-suppression circuits 412A and 412B. The operations of the on-die terminators ODT1 and ODT2 may be similar to those of on-die terminators ODT1 and ODT2 shown in FIG. 2, the details of which will not be repeated here.

In some embodiments, the differential amplifier 402 may be configured to amplify the data strobe signals DQS_c and DQS_t (e.g., input data strobe signals) to generate the data strobe signal *DQS_c and *DQS_t that are provided to the control circuit 122.

In some embodiments, the noise-suppression circuits 412A and 412B may be configured to suppress the noises of the data strobe signals DQS_t and DQS_c from ports A1 and A2 of the memory controller 110, respectively. For example, the noise-suppression circuit 412A may be coupled in parallel to the on-die terminator ODT1, and they may be coupled to the negative input terminal (−) of the differential amplifier 402. The noise-suppression circuit 412B may be in parallel to the on-die terminator ODT2, and they may be coupled to the positive input terminal (+) of the differential amplifier 402.

In some embodiments, the noise-suppression control circuit 410 may be configured to control the noise-suppression circuits 412A and 412B to couple or decouple the respective resistors DR from the negative input terminal and positive input terminal of the differential amplifier 402 using a noise-suppression control signal NSC.

Specifically, the noise-suppression circuits 412A and 412B may be controlled based on the data strobe signals DQS_t and DQS_c and the noise-suppression control signal NSC from the noise-suppression control circuit 410. For example, the noise-suppression circuit 412A may include transistors Q1 to Q3, and the respective resistor DR.

Transistors Q1, Q2, and Q3 may function as switches that are controlled by the data strobe signal *DQS_c and

*DQS_t, and the noise-suppression control signal NSC, respectively. Additionally, the noise-suppression circuit 412B may include transistors Q4 to Q6 and the respective resistor DR. Transistors Q4, Q5, and Q6 may function as switches that are controlled by the data strobe signal *DQS_c and *DQS_t, and the noise-suppression control signal NSC, respectively. In some embodiments, the resistances of the resistors DR may be approximately 40 ohms, but the present disclosure is not limited thereto. One having ordinary skill in the art can modify the resistance of the resistors DR according to practical needs.

In some embodiments, in response to the noise-suppression control signal NSC being in the low logic state, transistors Q3 and Q6 may be turned off, resulting in the grounding path of the respective resistors DR being cut off. Accordingly, the respective resistors DR may be decoupled from the negative input terminal and the positive input terminal of the differential amplifier 402 no matter whether the data strobe signals *DQS_t and *DQS_c are either in the high logic state or the low logic state.

In response to the noise-suppression control signal NSC being in the high logic state, transistors Q3 and Q6 may be turned on, resulting in the grounding path of the respective resistors DR being conducted. At this time, the coupling or decoupling of the resistors DR may be dependent on the logic states of the data strobe signals *DQS_t and *DQS_c. For example, when the data strobe signals *DQS_t and *DQS_c are in the low logic state, transistors Q1, Q2, Q4, and Q5 are turned on, resulting in the respective resistors DR being coupled to the negative input terminal and the positive input terminal of the differential amplifier 402.

When any of the data strobe signals *DQS_t and *DQS_c is in the high logic state, the paths from the negative input terminal to the respective resistor DR and from the positive input terminal to another respective resistor DR may be cut off, resulting in the respective resistors DR being decoupled from the negative input terminal and the positive input terminal of the differential amplifier 402. For example, when the data strobe signals *DQS_t and *DQS_c are respectively in the high logic state and the low logic state, transistors Q1 and Q4 are turned on, and transistors Q2 and Q5 are turned off, resulting in the respective resistors DR being decoupled from the negative input terminal and the positive input terminal of the differential amplifier 402. Similarly, when the data strobe signals *DQS_t and *DQS_c are respectively in the low logic state and the high logic state, transistors Q2 and Q5 are turned on, and transistors Q1 and Q4 are turned off, resulting in the respective resistors DR being decoupled from the negative input terminal and the positive input terminal of the differential amplifier 402. Likewise, when both the data strobe signals *DQS_t and *DQS_c are in the high logic state, transistors Q1-Q2 and Q4-Q5 are turned off, resulting in the respective resistors DR being decoupled from the negative input terminal and the positive input terminal of the differential amplifier 402.

The scheme for generating the noise-suppression control signal NSC by the noise-suppression control circuit 410 will be described in the following embodiments of FIGS. 5 to 9.

Figure 5A:
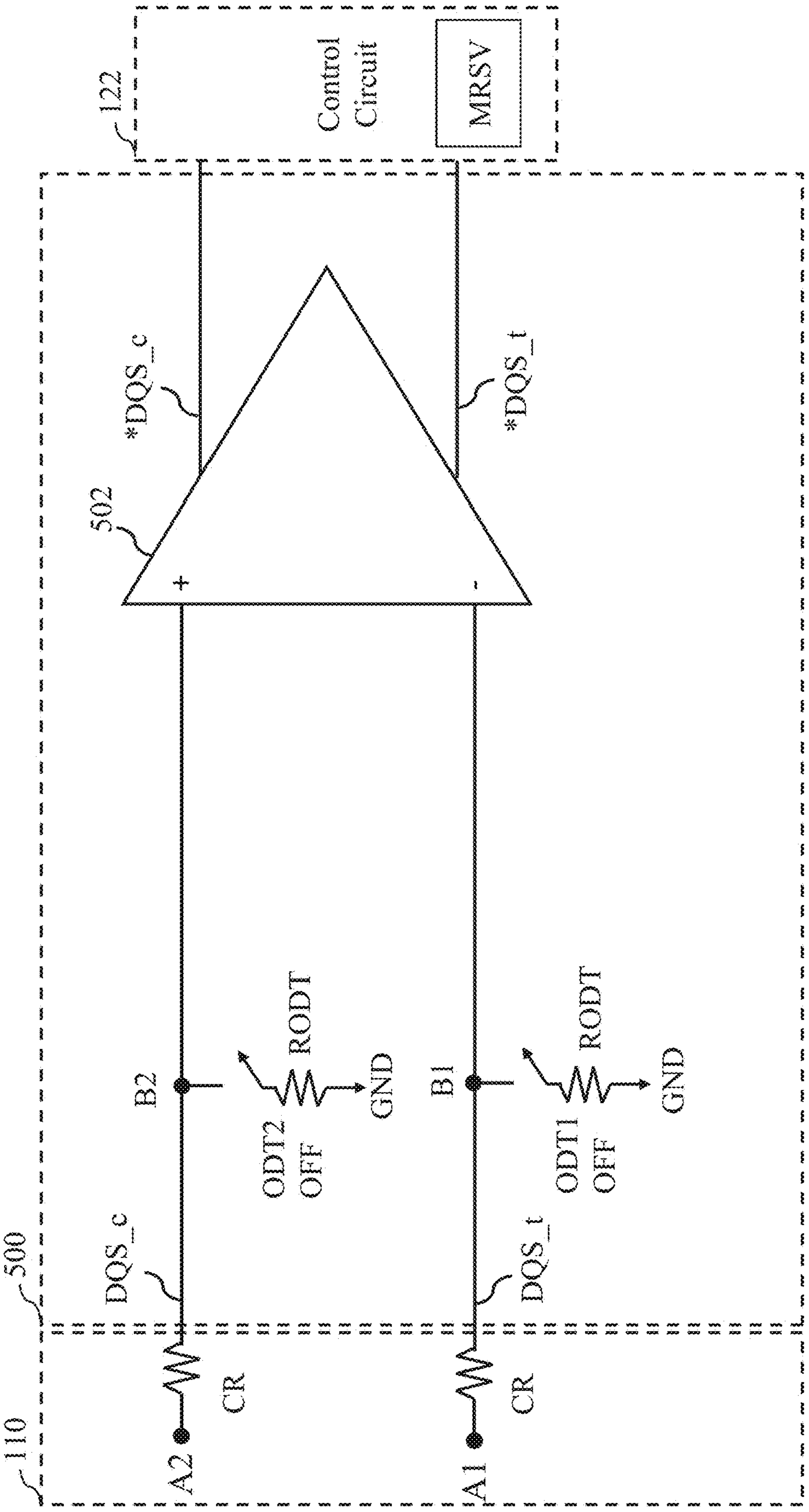
FIG. 5A is a schematic diagram of a receiver circuit in a first configuration in accordance with an embodiment of the present disclosure.
Figure 5B:
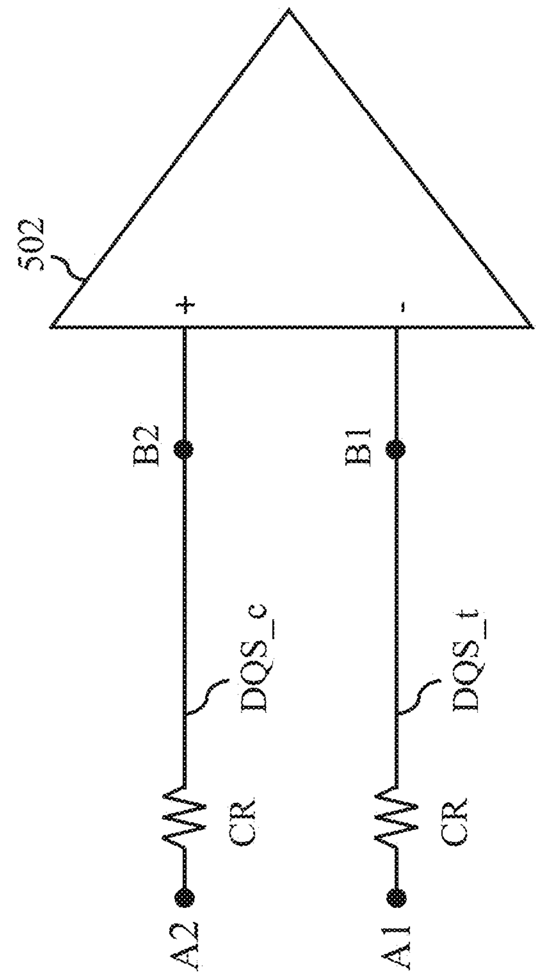
FIG. 5B is an equivalent schematic diagram of the receiver circuit in FIG. 5A.

FIG. 5A is a schematic diagram of a receiver circuit in a first configuration in accordance with an embodiment of the present disclosure. FIG. 5B is an equivalent schematic diagram of the receiver circuit in FIG. 5A.

In some embodiments, the receiver circuit 1211 shown in FIG. 1 can be implemented using the receiver circuit 500 shown in FIG. 5A. The receiver circuit 500 may include a differential amplifier 502 and on-die terminators ODT1 and ODT2. It should be noted that the receiver circuit 500 shown in FIG. 5A may be not equipped with the noise-suppression control circuit 410 and noise-suppression circuits 412A and 412B shown in FIG. 4. Additionally, the mode register setting value corresponding to the on-die terminators ODT1 an ODT2 may be set to 0 by the memory controller 110, resulting in the on-die terminators ODT1 and ODT2 being turned off (e.g., resistances RODT of the on-die terminators ODT1 and ODT2=∞), as shown in FIG. 5A. At this time, the data strobe signals DQS_t and DQS_t may be transferred from ports A1 and A2 to nodes B1 and B2 (e.g., negative input terminal and positive input terminal of the differential amplifier 502) through the respective output resistances CR, as shown in FIG. 5B.

Given that the amplitude of noises on the data strobe signal DQS_t is 134 mV, the voltage VB1 at node B1 can be calculated as $VB1=134*(RODT/(CR+RODT)=134*(\infty/(50+\infty)=134$ mV. The voltage VB2 at node B2 can be calculated in a similar manner. Specifically, when the on-die terminators ODT1 and ODT2 are turned off and no noise-suppression circuits are equipped, noises on the data strobe signals DQS_t and DQS_c will not be suppressed, and the logic states of the data strobe signals *DQS_t and *DQS_c generated by the differential amplifier 502 can be affected due to the noises.

Figure 6A:
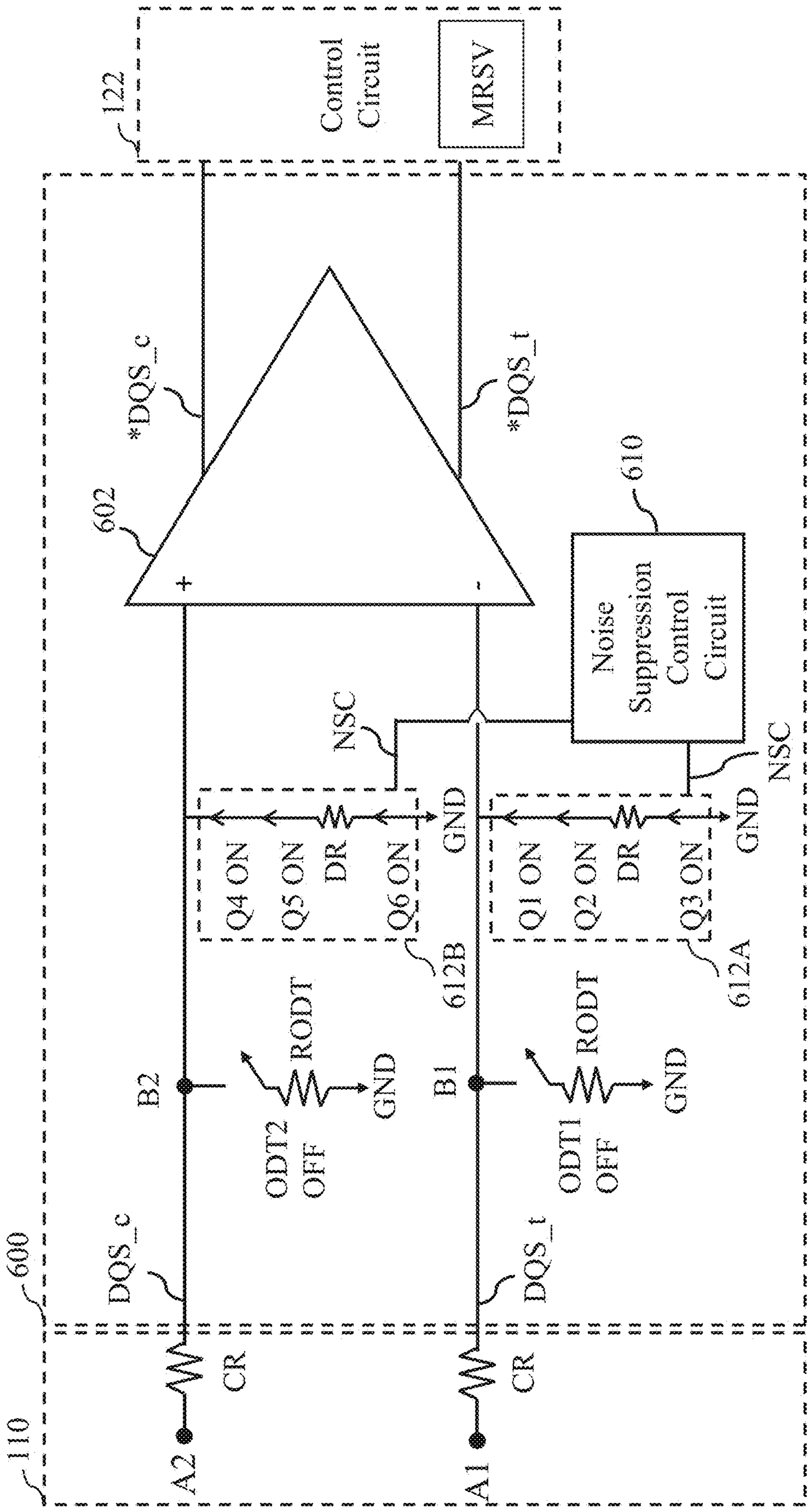
FIG. 6A is a schematic diagram of a receiver circuit in a second configuration in accordance with an embodiment of the present disclosure.
Figure 6B:
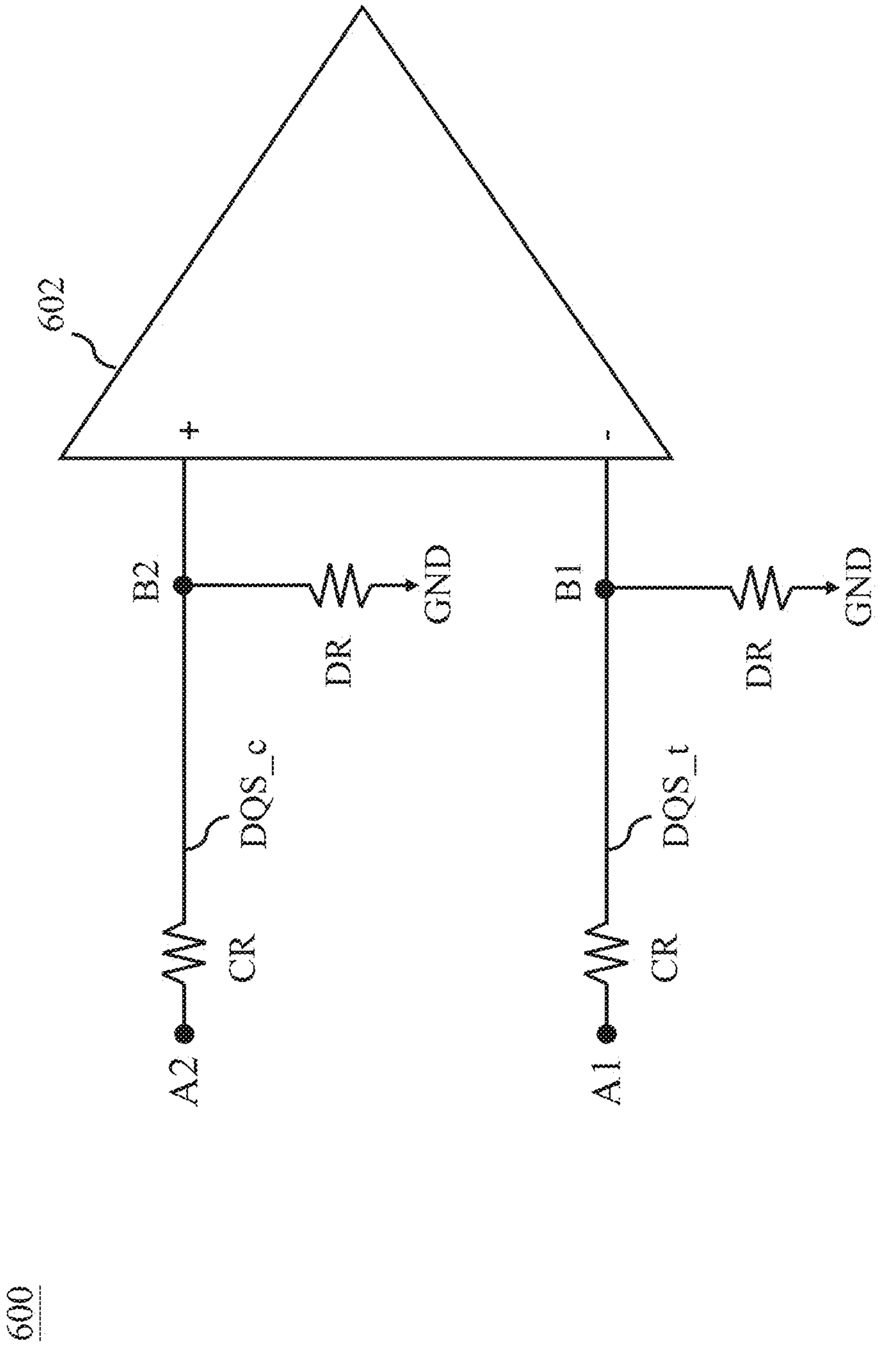
FIG. 6B is an equivalent schematic diagram of the receiver circuit in FIG. 6A.

FIG. 6A is a schematic diagram of a receiver circuit in a second configuration in accordance with an embodiment of the present disclosure. FIG. 6B is an equivalent schematic diagram of the receiver circuit in FIG. 6A.

In some embodiments, the receiver circuit 1211 shown in FIG. 1 can be implemented using the receiver circuit 600 shown in FIG. 6A. The receiver circuit 600 may include a differential amplifier 602, a noise-suppression control circuit 610, on-die terminators ODT1 and ODT2, and noise-suppression circuits 612A and 612B. For purposes of description, it is assumed that the data strobe signals *DQS_t and *DQS_c are in the low logic state and the noise-suppression control signal NSC is in the high logic state, resulting in transistors Q1 to Q6 being turned on. Thus, respective resistors DR may be coupled to the negative input terminal and positive input terminal of the differential amplifier 602. Additionally, the mode register setting value corresponding to the on-die terminators ODT1 an ODT2 may be set to 0 by the memory controller 110, resulting in the on-die terminators ODT1 and ODT2 being turned off (e.g., resistances RODT of the on-die terminators ODT1 and ODT2=0), as shown in FIG. 6A. At this time, the equivalent schematic diagram of the receiver circuit 600 can be referred to FIG. 6B.

Given that the amplitude of noises on the data strobe signal DQS_t is 134 mV, the voltage VB1 at node B1 can be calculated as $VB1=134*(DR/(CR+DR))=134*(40/(50+40))=59.5$ mV. The voltage VB2 at node B2 can be calculated in a similar manner. Specifically, when the on-die terminators ODT1 and ODT2 are turned off and transistors Q1 to Q6 of the noise-suppression circuits 612A and 612B are turned on, the noise amplitude on the data strobe signals DQS_t and DQS_c can be reduced below a particular voltage, such as approximately 90 mV. This prevents the logic states of the data strobe signals *DQS_t and *DQS_c, generated by the differential amplifier 602, from being affected by the noise.

Figure 7A:
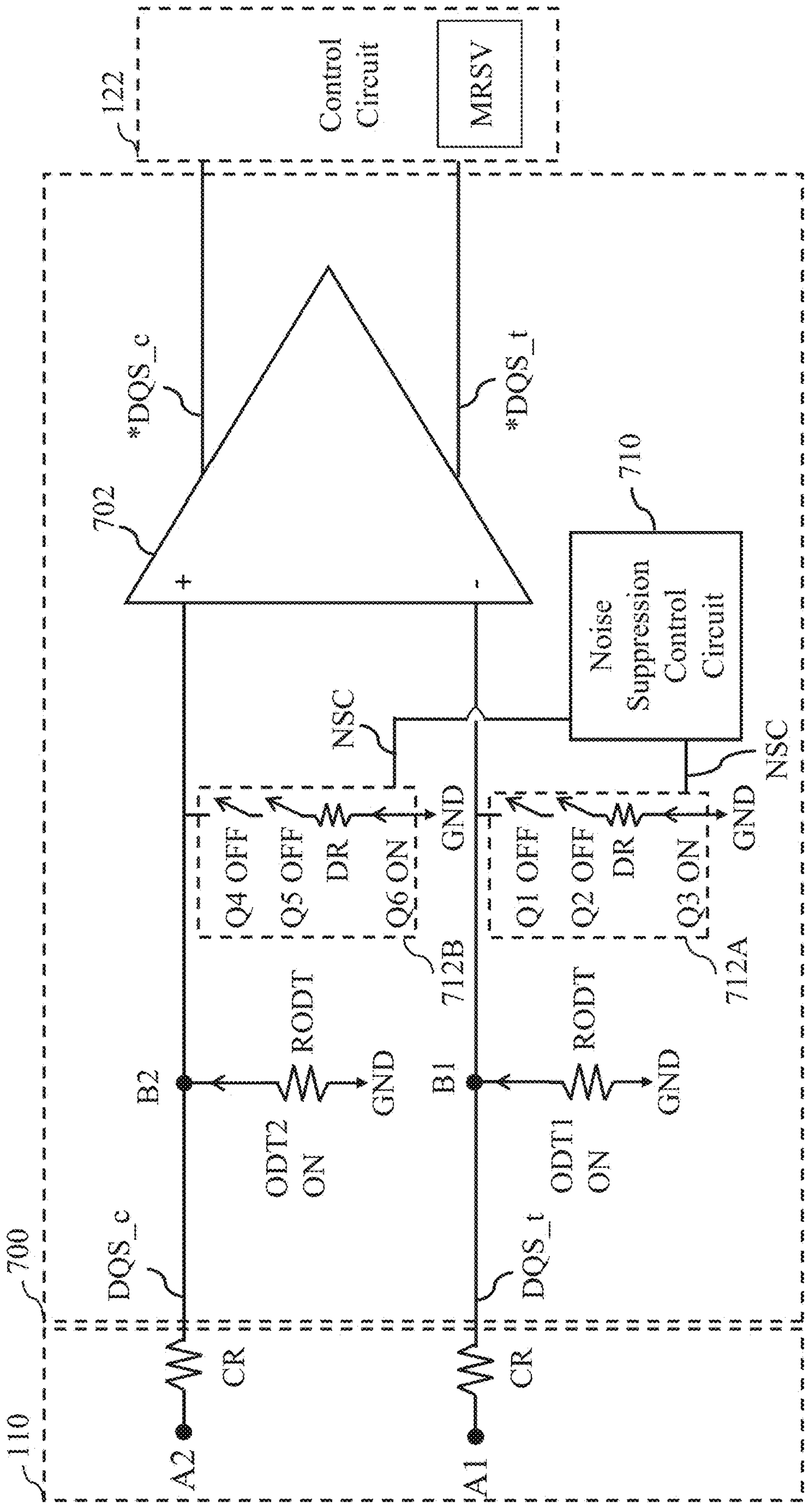
FIG. 7A is a schematic diagram of a receiver circuit in a third configuration in accordance with an embodiment of the present disclosure.
Figure 7B:
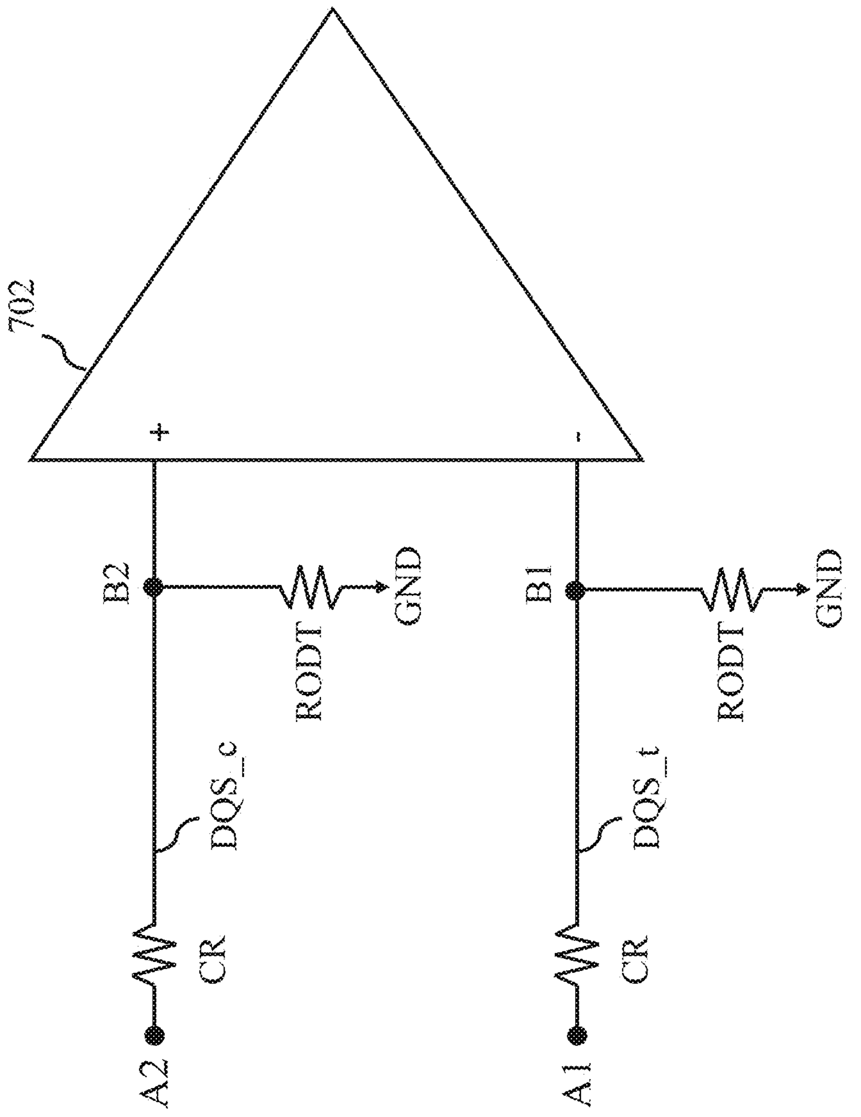
FIG. 7B is an equivalent schematic diagram of the receiver circuit in FIG. 7A.

FIG. 7A is a schematic diagram of a receiver circuit in a third configuration in accordance with an embodiment of the present disclosure. FIG. 7B is an equivalent schematic diagram of the receiver circuit in FIG. 7A.

In some embodiments, the receiver circuit 700 shown in FIG. 7A may include the noise-suppression circuits 712A and 712B which is similar to the noise-suppression circuits 412A and 412B in FIG. 4. For purposes of description, it is assumed that the data strobe signals *DQS_t and *DQS_c are in the high logic state and the noise-suppression control signal NSC is also in the high logic state, resulting in transistors Q1-Q2 and Q4-Q5 being turned off and transistors Q3 and Q6 being turned on. Thus, respective resistors DR may be decoupled from the negative input terminal and positive input terminal of the differential amplifier 702. Additionally, the mode register setting value corresponding to the on-die terminators ODT1 an ODT2 may be set to 1 by the memory controller 110, resulting in the resistance RODT of the on-die terminators ODT1 and ODT2 being 40 ohms, as shown in FIG. 7A. At this time, the equivalent schematic diagram of the receiver circuit 700 can be referred to FIG. 7B.

Given that the amplitude of noises on the data strobe signal DQS_t is 134 mV, the voltage VB1 at node B1 can be calculated as VB1=134*(RODT/(CR+RODT))=134*(40/(50+40))=59.5 mV. The voltage VB2 at node B2 can be calculated in a similar manner. Specifically, when the on-die terminators ODT1 and ODT2 are turned on and transistors Q1 to Q6 of the noise-suppression circuits 712A and 712B are turned off, the noise amplitude on the data strobe signals DQS_t and DQS_c can be reduced below a particular voltage, such as approximately 90 mV. This prevents the logic states of the data strobe signals *DQS_t and *DQS_c, generated by the differential amplifier 702, from being affected by the noise.

Figure 8A:
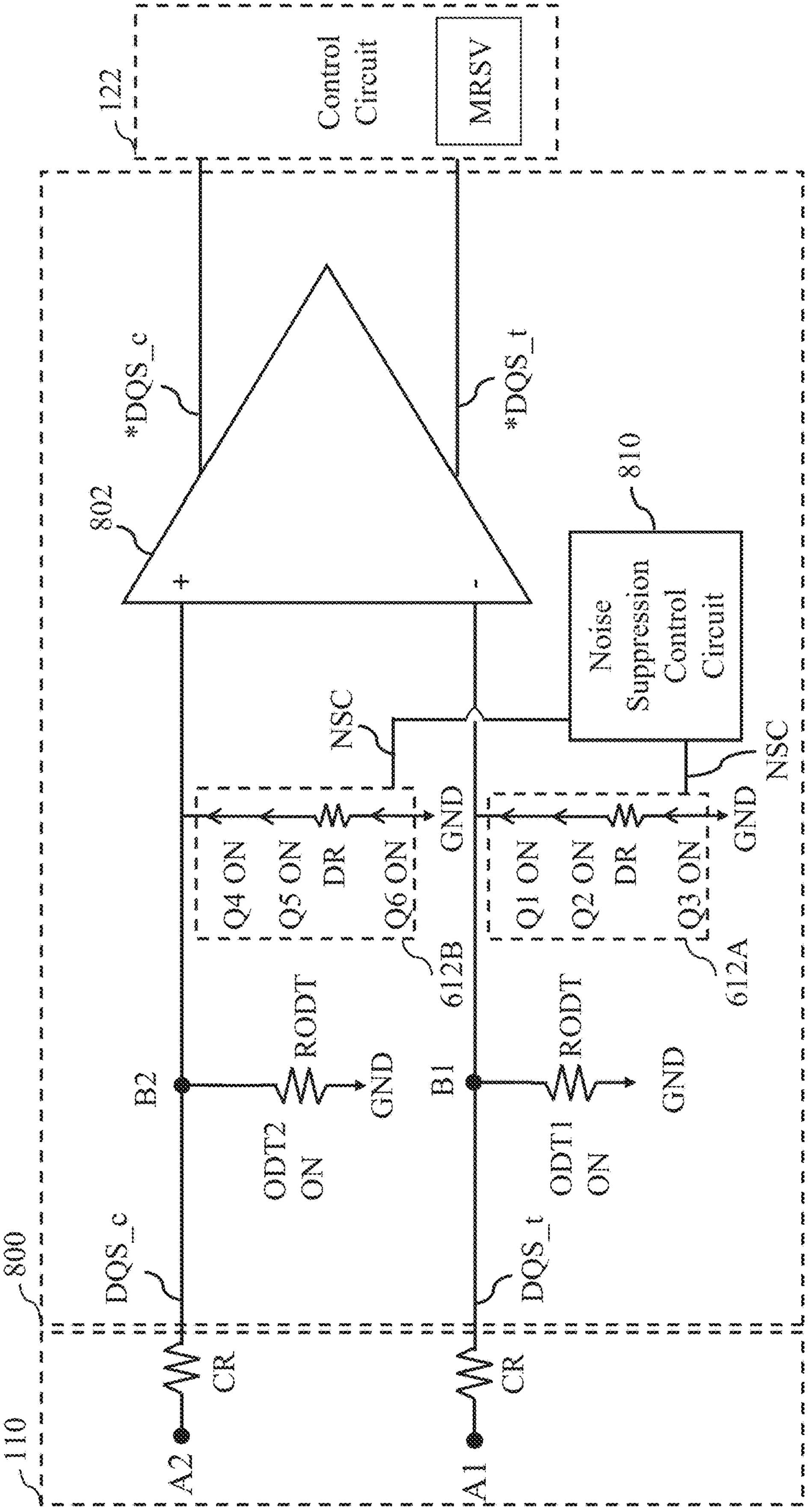
FIG. 8A is a schematic diagram of a receiver circuit in a fourth configuration in accordance with an embodiment of the present disclosure.
Figure 8B:
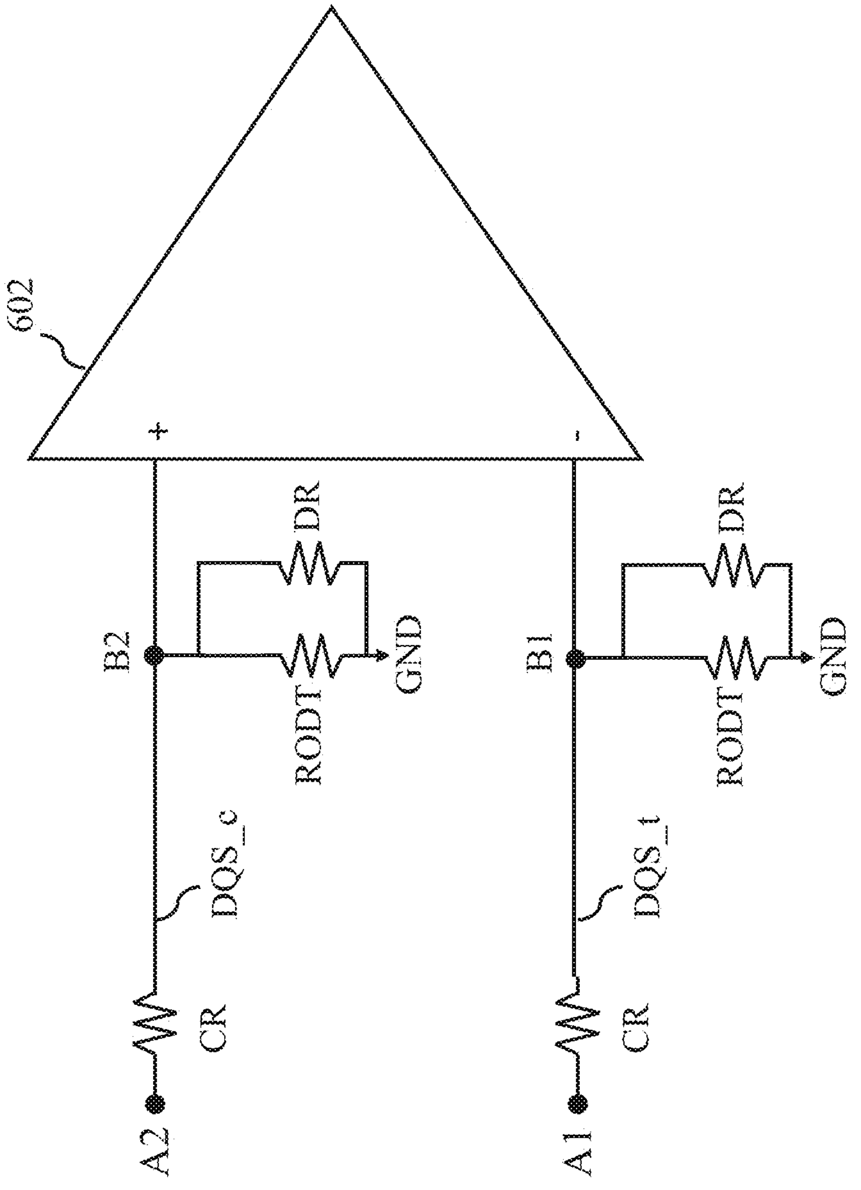
FIG. 8B is an equivalent schematic diagram of the receiver circuit in FIG. 8A.

FIG. 8A is a schematic diagram of a receiver circuit in a fourth configuration in accordance with an embodiment of the present disclosure. FIG. 8B is an equivalent schematic diagram of the receiver circuit in FIG. 8A.

In some embodiments, the receiver circuit 800 shown in FIG. 8A may include the noise-suppression circuits 812A and 812B which is similar to the noise-suppression circuits 412A and 412B in FIG. 4. For purposes of description, it is assumed that the data strobe signals *DQS_t and *DQS_c are in the low logic state, resulting in transistors Q1-Q2 and Q4-Q5 being turned on.

In some embodiments, the noise-suppression control circuit 810 may determine the logic state of the noise-suppression control signal NSC based on the mode register setting value corresponding to the on-die terminators ODT1 and ODT2. For example, when the mode register setting value is greater than a specific value (e.g., 2), the noise-suppression control circuit 810 may set the noise-suppression control signal NSC to the high logic state, resulting in transistors Q3 and Q6 being turned on, and the respective resistors DR being coupled to the negative input terminal and positive input terminal of the differential amplifier 802. Additionally, when the mode register setting value is equal to or less than specific value (e.g., 2), the noise-suppression control circuit 810 may set the noise-suppression control signal NSC to the low logic state, resulting in transistors Q3 and Q6 being turned off, and the respective resistors DR being decoupled from the negative input terminal and positive input terminal of the differential amplifier 802.

In a first scenario, the mode register setting value corresponding to the on-die terminators ODT1 an ODT2 may be set to 1 by the memory controller 110, resulting in the resistance RODT of the on-die terminators ODT1 and ODT2 being 40 ohms, as shown in FIG. 8A. If the noise-suppression control circuit 810 sets the noise-suppression control circuit NSC to the high-logic state without considering the mode register setting value corresponding to the on-die terminators ODT1 and ODT2, transistors Q3 and Q6 are turned on, resulting in the respective resistors DR being coupled to the negative input terminal and positive input terminal of the differential amplifier 802.

Referring to FIG. 8B, given that the amplitude of noises on the data strobe signal DQS_t is 134 mV, the voltage VB1 (e.g., DQS_t) at node B1 can be calculated VB1=134*((DR//RODT)/(CR+(DR//RODT)))=134*((40//40)/(50+(40//40)))= 134*(20/(50+20))=38.3 mV. The voltage VB2 (e.g., DQS_c) at node B2 can be calculated in a similar manner. Specifically, when the on-die terminators ODT1 and ODT2 are turned on and transistors Q1 to Q6 of the noise-suppression circuits 812A and 812B are turned on, the noise amplitude on the data strobe signals DQS_t and DQS_c can be reduced below a particular voltage, such as approximately 90 mV. This prevents the logic states of the data strobe signals *DQS_t and *DQS_c, generated by the differential amplifier 802, from being affected by the noise. However, when the resistance of the on-die terminators ODT1 and ODT2 is relatively small (e.g., 40 or 60 ohms), the noise suppression capability of the receiver circuit 800 may be too strong, resulting in the amplitude of the data strobe signals DQS_c and DQS_t being over-suppressed.

In a second scenario, the mode register setting value corresponding to the on-die terminators ODT1 an ODT2 may be set to 4 by the memory controller 110, resulting in the resistance RODT of the on-die terminators ODT1 and ODT2 being 120 ohms. Additionally, the noise-suppression control circuit 910 may set the noise-suppression control signal NSC to the low logic state based on the mode register setting value corresponding to the on-die terminators ODT1 and ODT2, resulting in the respective resistors DR being coupled to the negative input terminal and positive input terminal of the differential amplifier 802.

Referring to FIG. 8B, given that the amplitude of noises on the data strobe signal DQS_t is 134 mV, the voltage VB1 (e.g., DQS_t) at node B1 can be calculated as VB1=134*((DR//RODT)/(CR+(DR//RODT)))=134*((40//120)/(50+(40//120)))=134*(30/(50+30))=50.3 mV. The voltage VB2 (e.g., DQS_c) at node B2 can be calculated in a similar manner. Specifically, when the on-die terminators ODT1 and ODT2 are turned on and transistors Q1 to Q6 of the noise-suppression circuits 812A and 812B are turned on, the noise amplitude on the data strobe signals DQS_t and DQS_c can be reduced below a particular voltage, such as approximately 90 mV. This prevents the logic states of the data strobe signals *DQS_t and *DQS_c, generated by the differential amplifier 802, from being affected by the noise. It should be noted that the amplitude of the data strobe signals DQS_t and DQS_c will not be over-suppressed in the second scenario.

Figure 9A:
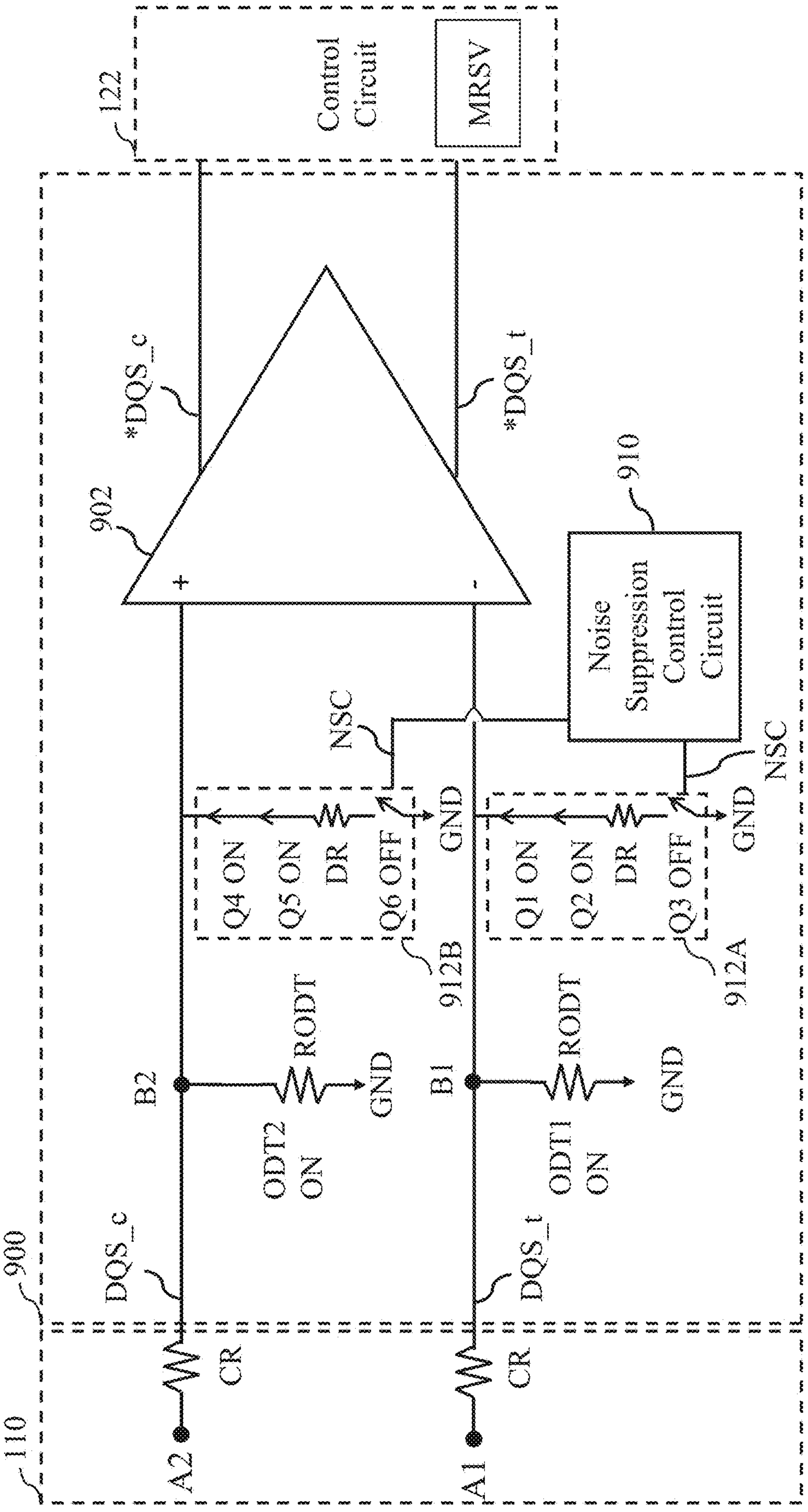
FIG. 9A is a schematic diagram of a receiver circuit in a fifth configuration in accordance with an embodiment of the present disclosure.
Figure 9B:
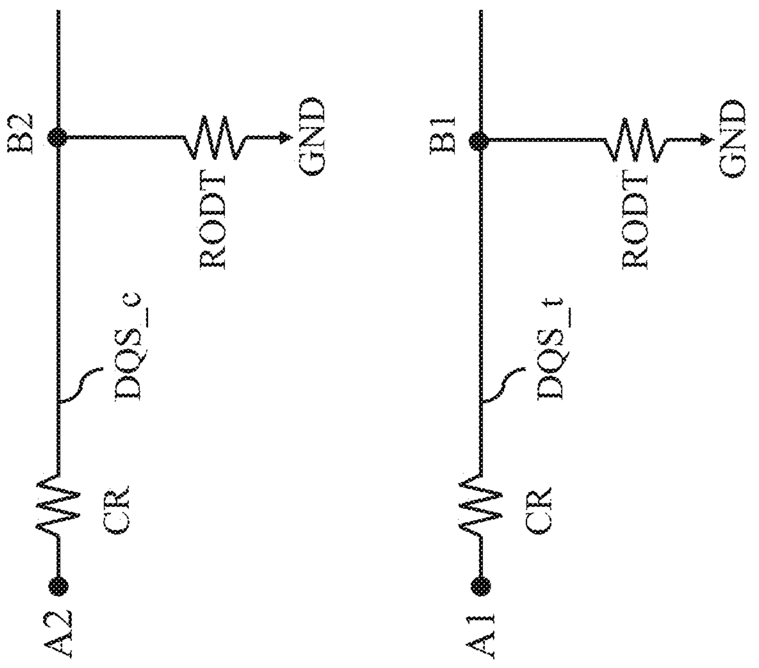
FIG. 9B is an equivalent schematic diagram of the receiver circuit in FIG. 9A.

FIG. 9A is a schematic diagram of a receiver circuit in a fifth configuration in accordance with an embodiment of the present disclosure. FIG. 9B is an equivalent schematic diagram of the receiver circuit in FIG. 9A.

In some embodiments, the receiver circuit 900 shown in FIG. 9A may include the noise-suppression circuits 912A and 912B which is similar to the noise-suppression circuits 412A and 412B in FIG. 4. For purposes of description, it is assumed that the data strobe signals *DQS_t and *DQS_c are in the low logic state, resulting in transistors Q1-Q2 and Q4-Q5 being turned on. Additionally, the mode register setting value corresponding to the on-die terminators ODT1 an ODT2 may be set to 1 by the memory controller 110, resulting in the resistance RODT of the on-die terminators ODT1 and ODT2 being 40 ohms, as shown in FIG. 9A. Accordingly, the noise-suppression control circuit 910 may set the noise-suppression control signal NSC to the low logic state based on the mode register setting value, resulting in the respective resistors DR being decoupled from the negative input terminal and positive input terminal of the differential amplifier 802.

Referring FIG. 9B, given that the noise amplitude on the data strobe signal DQS_t is 134 mV, the voltage VB1 (e.g., DQS_t) at node B1 can be calculated as VB1=134*(RODT/(CR+RODT))=134*(40/(50+40))=59.5 mV. The voltage VB2 (e.g., DQS_c) at node B2 (e.g., DQS_c) can be calculated in a similar manner. Specifically, when the on-die terminators ODT1 and ODT2 are turned off and transistors Q3 and Q6 of the noise-suppression circuits 912A and 912B are turned off, the noise amplitude on the data strobe signals DQS_t and DQS_c can be reduced below a particular voltage, such as approximately 90 mV. This prevents the logic states of the data strobe signals *DQS_t and *DQS_c, generated by the differential amplifier 902, from being affected by the noise.

Figure 10:
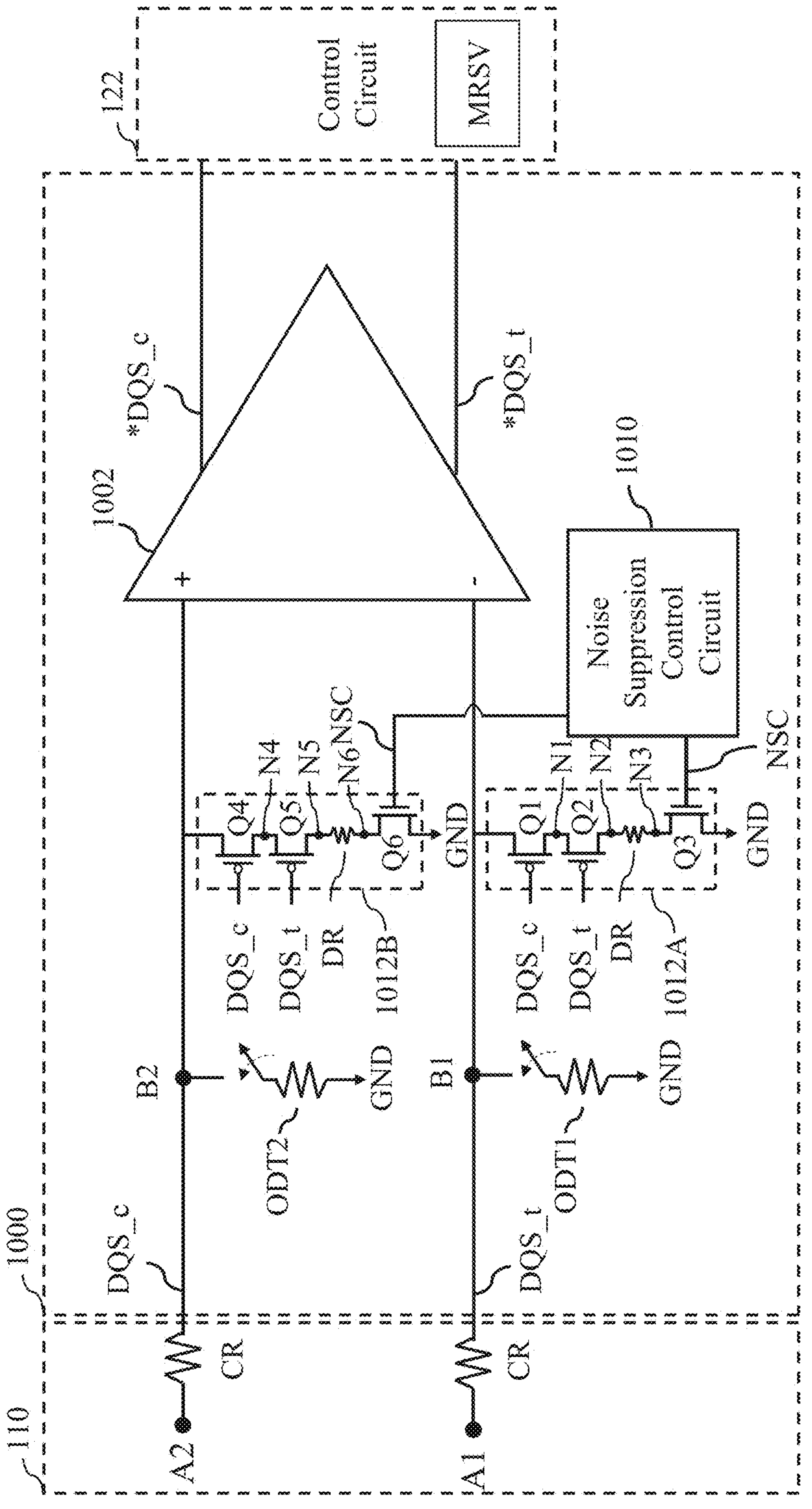
FIG. 10 is a schematic diagram of a receiver circuit in accordance with another embodiment of the present disclosure.

FIG. 10 is a schematic diagram of a receiver circuit in accordance with another embodiment of the present disclosure.

The receiver circuit 1000 shown in FIG. 10 may be similar to the receiver circuit 400 shown in FIG. 4, with the difference being that transistors Q1 and Q4 are controlled by the data strobe signal DQS_c, and transistors Q2 and Q5 are controlled by the data strobe signal DQS_t. The operations of the receiver circuit 1000 shown in FIG. 10 may be similar to those of the receiver circuit 400 shown in FIG. 4, the details of which are not repeated here.

Figure 11:
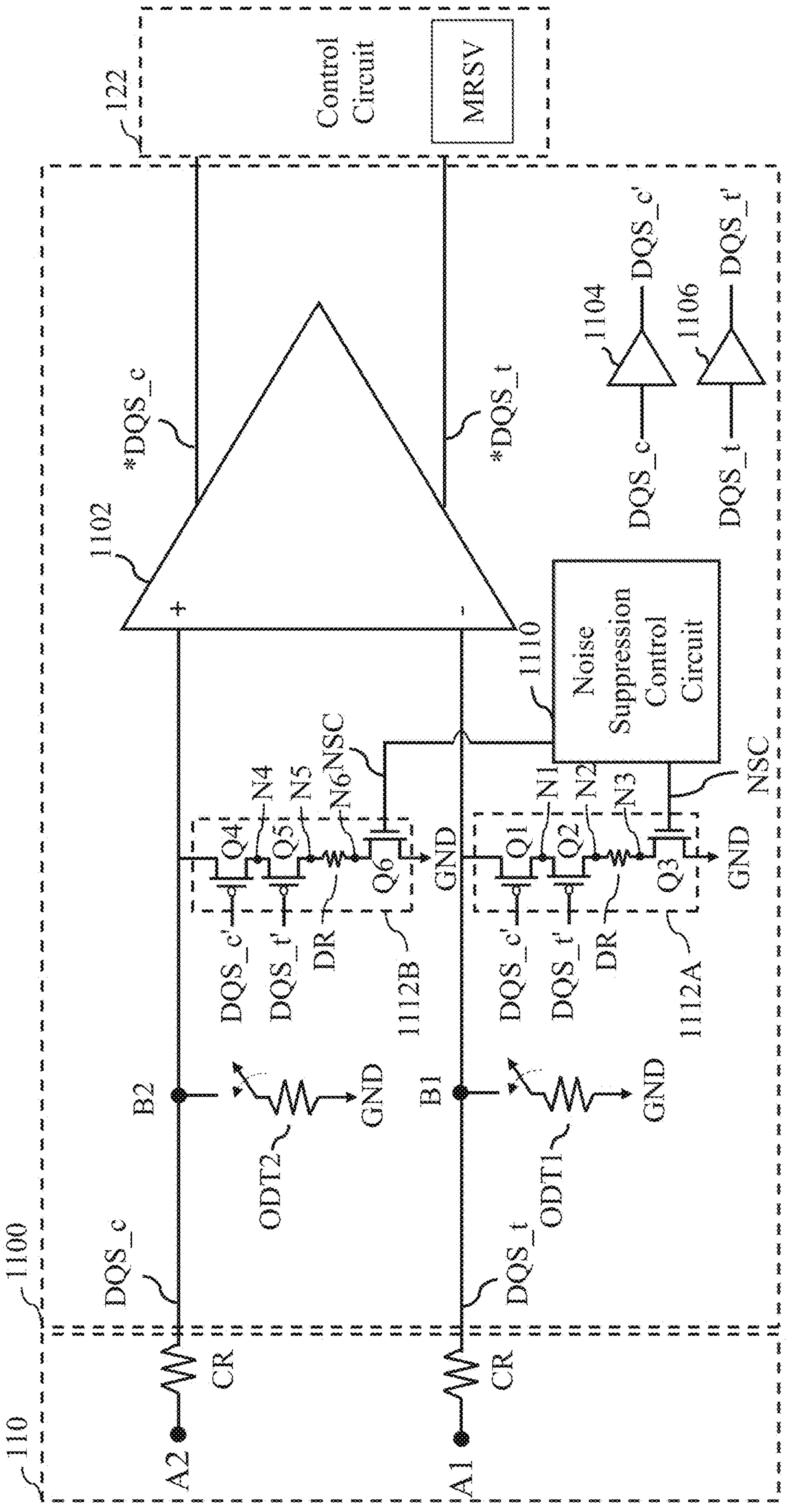
FIG. 11 is a schematic diagram of a receiver circuit in accordance with yet another embodiment of the present disclosure.

FIG. 11 is a schematic diagram of a receiver circuit in accordance with yet another embodiment of the present disclosure.

The receiver circuit 1100 shown in FIG. 11 may be similar to the receiver circuit 400 shown in FIG. 4, with the difference being that transistors Q1 and Q4 are controlled by a data strobe signal DQS_c', and transistors Q2 and Q5 are controlled by a data strobe signal DQS_t'.

In some embodiments, the memory device 120 may be operated using a power supply voltage of 0.6V or 1.1V. However, the amplitude of the data strobe signals DQS_c and DQS_t from the memory controller 110 is between 50 mv and 100 mv, the voltage level of which is insufficient for the control circuit 122 to perform a write or read operation on the memory device 120. In addition, the amplitude of the data strobe signals DQS_c and DQS_t is insufficient to turn on the transistors Q1-Q2 and Q4-Q5 since the threshold voltage of the transistors Q1-Q2 and Q4-Q5 may be between 0.5V and 0.7V. The amplitude of the amplified data strobe signals DQS_c' and DQS_t' generated by the amplifiers 1104 and 1106 may be between 0.6V and 1.1V, the voltage level of which is sufficient for the control circuit 122 to perform a write or read operation on the memory device 120, and sufficient to turn on the transistors Q1-Q2 and Q4-Q5. The operations of the receiver circuit 1100 shown in FIG. 11 may be similar to those of the receiver circuit 400 shown in FIG. 4, the details of which are not repeated here.

Figure 12:
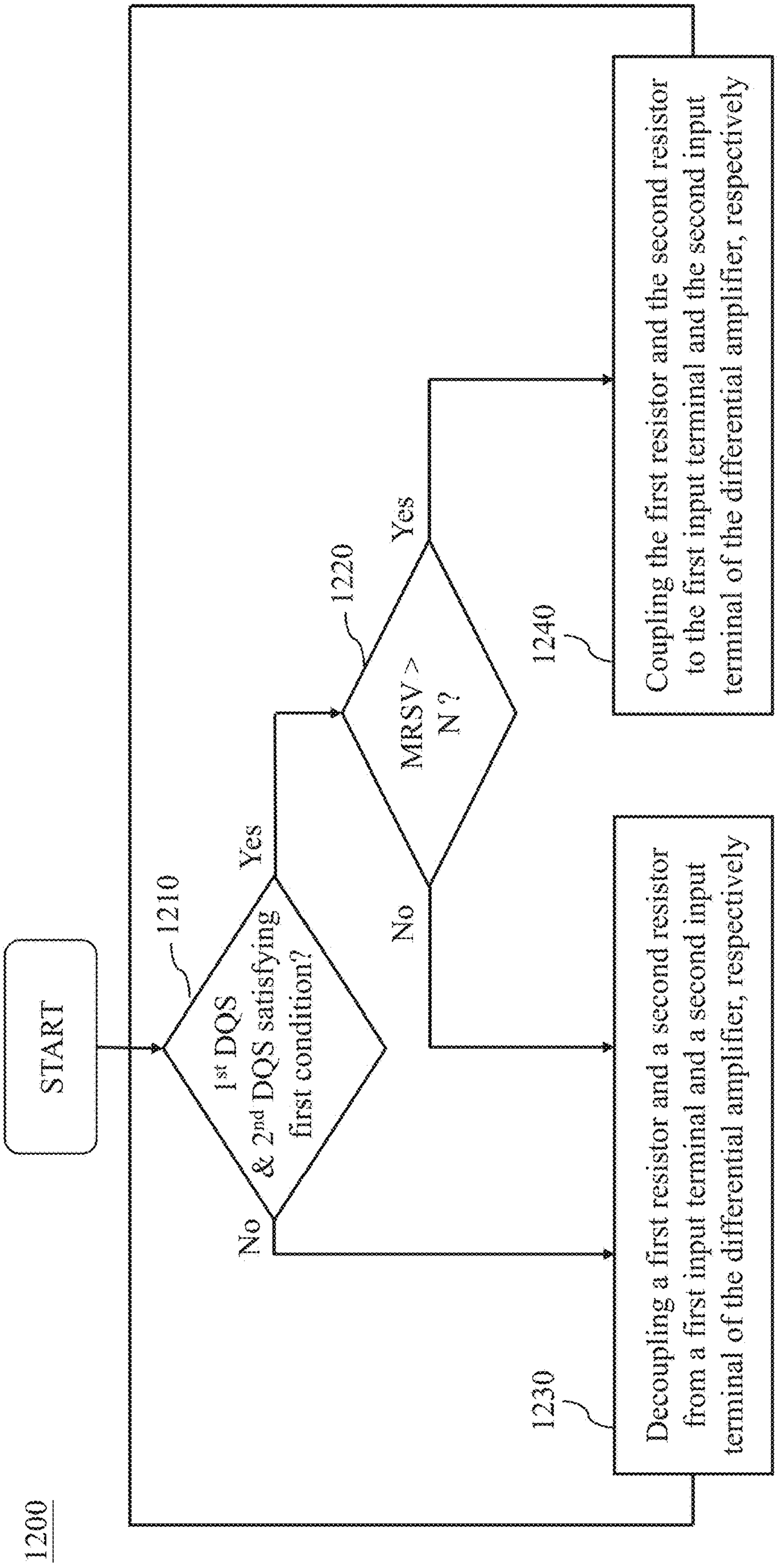
FIG. 12 is a flowchart of a method for adaptive noise suppression on data strobe signals in accordance with an embodiment of the present disclosure.

FIG. 12 is a flowchart of a method for adaptive noise suppression on data strobe signals in accordance with an embodiment of the present disclosure. Please refer to FIG. 1, FIG. 4, and FIG. 12.

Step 1210: Determining whether of a first data strobe signal (e.g., $1^{st}$ DQS, such as DQS_c) and a second data strobe signal (e.g., $2^{nd}$ DQS, such as DQS_t) from a memory controller (e.g., memory controller 110) satisfy a first condition (e.g., DQS_c=DQS_t=0). When it is determined that the first data strobe signal and the second data strobe signal satisfy the first condition, step 1220 is performed. When it is determined that the first data strobe signal and the second data strobe signal do not satisfy the first condition, step 1230 is performed. For example, when a write data strobe (WDQS) function of the memory controller is turned off, the data strobe signals DQS_t and DQS_c in the low logic state from the memory controller may be affected by the noises thereon since the noises are amplified by the differential amplifier in the receiver circuit of the LPDDR4 memory, leading to malfunctions or failures of the control circuit of the LPDDR4 memory.

Step 1220: Determining whether a mode register setting value (MRSV) corresponding to a first on-die terminator (e.g., ODT1) and a second one-die terminator (e.g., ODT1) is larger than N, where is N is a positive integer. For example, the noise-suppression control circuit 410 may determine whether the mode register setting value is larger than N (e.g., 2). In response to the mode register setting value being larger than N, step 1240 is performed. In response to the mode register setting value being equal to or smaller than N, step 1230 is performed.

In some embodiments, when the mode register setting value (MRSV) corresponding to the on-die terminators ODT1 and ODT2 is set to 0, the on-die terminators ODT1 and ODT2 may be turned off to function as open circuits (e.g., resistance=∞). When the mode register setting value corresponding to the on-die terminators ODT1 and ODT2 is set to 1, 2, 3, 4, and 5, the resistances of the on-die terminators ODT1 and ODT2 may be 40 ohms, 60 ohms, 80 ohms, 120 ohms, 240 ohms, respectively, but the present disclosure is not limited thereto.

Step 1230: Decoupling a first resistor (e.g., low-side resistor DR) and a second resistor (e.g., high-side resistor DR) from a first input terminal (e.g., negative input terminal) and a second input terminal (e.g., positive input terminal) of the differential amplifier (e.g., differential amplifier 402), respectively. For example, when the MRSV is equal to or lower than N (e.g., 2), it may indicate that the resistances of the on-die terminators ODT1 and ODT2 are relatively low, such as approximately 40 or 60 ohms. If the respective resistors DR of the noise-suppression circuits 412A and 412B is coupled to the negative input terminal and positive input terminal of the differential amplifier 402, the noise-suppression capability of the receiver circuit 400 may be too strong, resulting in the data strobe signals DQS_t and DQS_c being over-suppressed. Accordingly, the noise-suppression control circuit 410 may issue a noise-suppression control signal NSC in the low logic state to turn off transistor Q3 and Q6, resulting in the respective resistors DR being decoupled from the negative input terminal and positive input terminal of the differential amplifier 402.

Step 1240: Coupling the first resistor (e.g., low-side resistor DR) and the second resistor (e.g., high-side resistor DR) from the first input terminal (e.g., negative input terminal) and the second input terminal (e.g., positive input terminal) of the differential amplifier (e.g., differential amplifier 402), respectively. For example, when the MRSV is greater than N (e.g., 2), it may indicate that the resistances of the on-die terminators ODT1 and ODT2 are relatively high, such as approximately 80, 120, or 240 ohms. If the respective resistors DR of the noise-suppression circuits 412A and 412B is coupled to the negative input terminal and positive input terminal of the differential amplifier 402, the noise-suppression capability of the receiver circuit 400 may be not too strong, resulting in the data strobe signals DQS_t and DQS_c not being over-suppressed. Accordingly, the noise-suppression control circuit 410 may issue a noise-suppression control signal NSC in the high logic state to turn on transistor Q3 and Q6, resulting in the respective resistors DR being coupled to the negative input terminal and positive input terminal of the differential amplifier 402.

In an aspect of the present disclosure, a memory device is provided. The memory device includes a memory cell array, a control circuit, and a receiver circuit. The control circuit is configured to control data access of the memory cell array. The receiver circuit is configured to receive a first data strobe signal and a second data strobe signal from a memory controller. The receiver circuit includes a differential amplifier, a first on-die terminator, a second on-die terminator, a noise-suppression control circuit, a first noise-suppression circuit, and a second noise-suppression circuit. The differential amplifier is configured to amplify the first data strobe signal and the second data strobe signal to generate a third data strobe signal and a fourth data strobe signal. The first on-die terminator is coupled to a first input terminal of the differential amplifier. The second on-die terminator is coupled to a second input terminal of the differential amplifier. The noise-suppression control circuit is configured to generate a noise-suppression control signal based on a mode register setting value corresponding to the first on-die terminator and the second on-die terminator. The first noise-suppression circuit is configured to selectively couple a first resistor to the first input terminal of the differential amplifier according to the third data strobe signal, the fourth data strobe signal, and the noise-suppression control signal. The second noise-suppression circuit is configured to selectively couple a second resistor to the second input terminal of the differential amplifier according to the third data strobe signal, the fourth data strobe signal, and the noise-suppression control signal.

In some embodiments, a first resistance of the first on-die terminator and a second resistance of the second on-die terminator are substantially the same.

In some embodiments, the first resistance and the second resistance are determined based on the mode register setting value corresponding to the first on-die terminator and the second on-die terminator.

In some embodiments, when the mode register setting value is equal to 0, the first on-die terminator and the second on-die terminator are open-circuited.

In some embodiments, a third resistance of the first resistor and a fourth resistance of the second resistor are substantially equal to the first resistance and the second resistance when the mode register setting value is set to 1.

In some embodiments, in response to the mode register setting value being greater than a specific value, the noise-suppression control signal generated by the noise-suppression control circuit is in a high logic state, and in response to the mode register setting value being equal to or less than the specific value, the noise-suppression control signal generated by the noise-suppression control circuit is in a low logic state. The specific value is 2.

In some embodiments, the first noise-suppression circuit includes a first transistor, a second transistor, the first resistor, and a third transistor. The first transistor has a control terminal coupled to the third data strobe signal, a first terminal coupled to the first input terminal of the differential amplifier, and a second terminal coupled to a first node. The second transistor has a control terminal coupled to the fourth data strobe signal, a first terminal coupled to the first node, and a second terminal coupled to a second node. The first resistor is coupled between the second node and a third node. The third transistor has a control terminal coupled to the noise-suppression control signal, a first terminal coupled to the third node, and a second terminal coupled to a ground voltage.

In some embodiments, the second noise-suppression circuit includes a fourth transistor, a fifth transistor, the second resistor, and a sixth transistor. The fourth transistor has a control terminal coupled to the third data strobe signal, a first terminal coupled to the second input terminal of the differential amplifier, and a second terminal coupled to a fourth node. The fifth transistor has a control terminal coupled to the fourth data strobe signal, a first terminal coupled to the fourth node, and a second terminal coupled to a fifth node. The second resistor is coupled between the fifth node and a sixth node. The sixth transistor has a control terminal coupled to the noise-suppression control signal, a first terminal coupled to the sixth node, and a second terminal coupled to the ground voltage.

In some embodiments, the first transistor, the second transistor, the fourth transistor, and the fifth transistor are P-type transistors, and the third transistor and the sixth transistor are N-type transistors.

In some embodiments, when any of the third data strobe signal and the fourth data strobe signal is in a high logic state, the first resistor and the second resistor are decoupled from the first input terminal and the second input terminal of the differential amplifier, respectively.

In some embodiments, when the third data strobe signal and the fourth data strobe signal are in the low logic state and the noise-suppression control signal is in the high logic state, the first resistor and the second resistor are coupled to the first input terminal and the second input terminal of the differential amplifier, respectively.

In another aspect of the present disclosure, a memory device is provided. The memory device includes a memory cell array, a control circuit, and an interface circuit. The control circuit is configured to control data access of the memory cell array. The receiver circuit is configured to amplify the first data strobe signal and the second data strobe signal to generate a third data strobe signal and a fourth data strobe signal. In response to the first data strobe signal and the second data strobe signal satisfying a predetermined condition, the receiver circuit is further configured to selectively couple a first resistor and a second resistor to the first data strobe signal and the second data strobe signal for noise suppression based on a mode register setting value, respectively.

In some embodiments, the receiver circuit includes a differential amplifier, a first on-die terminator, and a second on-die terminator. The differential amplifier is configured to amplify the first data strobe signal and the second data strobe signal to generate the third data strobe signal and the fourth data strobe signal. The first on-die terminator is coupled to a first input terminal of the differential amplifier. The second on-die terminator is coupled to a second input terminal of the differential amplifier. A first resistance of the first on-die terminator and a second resistance of the second on-die terminator are determined based on the mode register setting value.

In some embodiments, the first resistance of the first on-die terminator and the second resistance of the second on-die terminator are substantially the same.

In some embodiments, when the mode register setting value is equal to 0, the first on-die terminator and the second on-die terminator are open-circuited.

In some embodiments, the receiver circuit further includes a noise-suppression control circuit, a first noise-suppression circuit, and a second noise-suppression circuit. The noise-suppression control circuit is configured to generate a noise-suppression control signal based on the mode register setting value corresponding to the first on-die terminator and the second on-die terminator. The first noise-suppression circuit is configured to selectively couple the first resistor to the first input terminal of the differential amplifier according to a first control signal, a second control signal, and the noise-suppression control signal. The second noise-suppression circuit is configured to selectively couple the second resistor to the second input terminal of the differential amplifier according to the first control signal, the second control signal, and the noise-suppression control signal.

In some embodiments, the first control signal and the second control signal are the third data strobe signal and the fourth data strobe signal, respectively.

In some embodiments, the first control signal and the second control signal are the first data strobe signal and the second data strobe signal, respectively.

In some embodiments, the receiver circuit further includes a first amplifier and a second amplifier. The first amplifier is configured to amplify the first data strobe signal to generate a first amplified data strobe signal. The second amplifier is configured to amplify the second data strobe signal to generate a second amplified data strobe signal. The first control signal and the second control signal are the first amplified data strobe signal and the second amplified data strobe signal, respectively.

In some embodiments, a third resistance of the first resistor and a fourth resistance of the second resistor are substantially equal to the first resistance and the second resistance when the mode register setting value is set to 1.

In some embodiments, in response to the mode register setting value being greater than a specific value, the noise-suppression control signal generated by the noise-suppression control circuit is in a high low logic. In response to the mode register setting value being equal to or less than the specific value, the noise-suppression control signal generated by the noise-suppression control circuit is in a low logic state. The specific value is 2

In some embodiments, the first noise-suppression circuit includes a first transistor, a second transistor, the first resistor, and a third transistor. The first transistor has a control terminal coupled to the first control signal, a first terminal coupled to the first input terminal of the differential amplifier, and a second terminal coupled to a first node. The second transistor has a control terminal coupled to the second control signal, a first terminal coupled to the first node, and a second terminal coupled to a second node. The first resistor is coupled between the second node and a third node. The third transistor has a control terminal coupled to the noise-suppression control signal, a first terminal coupled to the third node, and a second terminal coupled to a ground voltage.

In some embodiments, the second noise-suppression circuit includes a fourth transistor, a fifth transistor, the second resistor, and a sixth transistor. The fourth transistor has a control terminal coupled to the first control signal, a first terminal coupled to the second input terminal of the differential amplifier, and a second terminal coupled to a fourth node. The fifth transistor has a control terminal coupled to the second control signal, a first terminal coupled to the fourth node, and a second terminal coupled to a fifth node. The second resistor is coupled between the fifth node and a sixth node. The sixth transistor has a control terminal coupled to the noise-suppression control signal, a first terminal coupled to the sixth node, and a second terminal coupled to the ground voltage.

In some embodiments, the first transistor, the second transistor, the fourth transistor, and the fifth transistor are P-type transistors, and the third transistor and the sixth transistor are N-type transistors.

In yet another aspect of the present disclosure, a method for adaptive noise suppression on data strobe signals for use in a memory device is provided. The memory device includes a receiver circuit having a differential amplifier, a first on-die terminator, a second on-die terminator. The method includes the following steps: determining whether a first data strobe signal and a second data strobe signal from a memory controller satisfy a first condition; in response to the first data strobe signal and the second data strobe signal satisfying the first condition, determining whether a mode register setting value associated with the first on-die terminator and the second on-die terminator is greater than N, wherein N is a positive integer; and in response to the mode register setting value being not greater than N, decoupling a first resistor and a second resistor from a first input terminal and a second input terminal of the differential amplifier, respectively; and in response to the mode register setting value being greater than N, coupling the first resistor and the second resistor to the first input terminal and the second input terminal of the differential amplifier, respectively.

In some embodiments, the method further includes the following step: in response to the first data strobe signal and the second data strobe signal satisfying the first condition, decoupling the first resistor and the second resistor from the first input terminal and the second input terminal of the differential amplifier, respectively.

In some embodiments, the first condition indicates that the first data strobe signal and the second data strobe signal are in a low logic state.

In some embodiments, a first resistance of the first on-die terminator and a second resistance of the second on-die terminator are determined based on the mode register setting value corresponding to the first on-die terminator and the second on-die terminator.

In some embodiments, the receiver circuit further comprises a noise-suppression control circuit, a first noise-suppression circuit, and a second noise-suppression circuit. The method further includes the following steps: utilizing the differential amplifier to amplify the first data strobe signal and the second data strobe signal to generate a third data strobe signal and a fourth data strobe signal; utilizing the noise-suppression control circuit to generate a noise-suppression control signal based on the mode register setting value corresponding to the first on-die terminator and the second on-die terminator; utilizing the first noise-suppression circuit to selectively couple the first resistor to the first input terminal of the differential amplifier according to the third data strobe signal, the fourth data strobe signal, and the noise-suppression control signal; and utilizing the second noise-suppression circuit to selectively couple the second resistor to the second input terminal of the differential amplifier according to the third data strobe signal, the fourth data strobe signal, and the noise-suppression control signal.

In some embodiments, in response to the mode register setting value being greater than a specific value, the noise-suppression control signal generated by the noise-suppression control circuit is in a high low logic, and in response to the mode register setting value being equal to or less than the specific value, the noise-suppression control signal generated by the noise-suppression control circuit is in a low logic state.

Although the present disclosure and its advantages have been described in detail, it should be understood that various changes, substitutions and alterations can be made herein without departing from the spirit and scope of the disclosure as defined by the appended claims.

For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, or steps.

What is claimed is:

1. A method for adaptive noise suppression on data strobe signals, for use in a memory device, wherein the memory device comprises a receiver circuit having a differential amplifier, a first on-die terminator, a second on-die terminator, the method comprising:

determining whether a first data strobe signal and a second data strobe signal from a memory controller satisfy a first condition;

in response to the first data strobe signal and the second data strobe signal satisfying the first condition, determining whether a mode register setting value associated with the first on-die terminator and the second on-die terminator is greater than N, wherein N is a positive integer;

in response to the mode register setting value being not greater than N, decoupling a first resistor and a second resistor from a first input terminal and a second input terminal of the differential amplifier, respectively;

in response to the mode register setting value being greater than N, coupling the first resistor and the second resistor to the first input terminal and the second input terminal of the differential amplifier, respectively; and in response to the first data strobe signal and the second data strobe signal not satisfying the first condition, decoupling the first resistor and the second resistor from the first input terminal and the second input terminal of the differential amplifier, respectively;

wherein a first resistance of the first on-die terminator and a second resistance of the second on-die terminator are determined based on the mode register setting value corresponding to the first on-die terminator and the second on-die terminator;

wherein the first resistance of the first on-die terminator and the second resistance of the second on-die terminator are equal;

wherein the first condition indicates that the first data strobe signal and the second data strobe signal are in a low logic state.

2. A method for adaptive noise suppression on data strobe signals, for use in a memory device, wherein the memory device comprises a receiver circuit having a differential amplifier, a first on-die terminator, a second on-die terminator, the method comprising:

determining whether a first data strobe signal and a second data strobe signal from a memory controller satisfy a first condition;

in response to the first data strobe signal and the second data strobe signal satisfying the first condition, determining whether a mode register setting value associated with the first on-die terminator and the second on-die terminator is greater than N, wherein N is a positive integer;

in response to the mode register setting value being not greater than N, decoupling a first resistor and a second resistor from a first input terminal and a second input terminal of the differential amplifier, respectively;

in response to the mode register setting value being greater than N, coupling the first resistor and the second resistor to the first input terminal and the second input terminal of the differential amplifier, respectively; and in response to the first data strobe signal and the second data strobe signal not satisfying the first condition, decoupling the first resistor and the second resistor from the first input terminal and the second input terminal of the differential amplifier, respectively;

wherein a first resistance of the first on-die terminator and a second resistance of the second on-die terminator are determined based on the mode register setting value corresponding to the first on-die terminator and the second on-die terminator;

wherein the first resistance of the first on-die terminator and the second resistance of the second on-die terminator are equal;

wherein the receiver circuit further comprises a noise-suppression control circuit, a first noise-suppression circuit, and a second noise-suppression circuit, and the method further comprises:

utilizing the differential amplifier to amplify the first data strobe signal and the second data strobe signal to generate a third data strobe signal and a fourth data strobe signal;

utilizing the noise-suppression control circuit to generate a noise-suppression control signal based on the mode register setting value corresponding to the first on-die terminator and the second on-die terminator;

utilizing the first noise-suppression circuit to selectively couple the first resistor to the first input terminal of the differential amplifier according to the third data strobe signal, the fourth data strobe signal, and the noise-suppression control signal; and utilizing the second noise-suppression circuit to selectively couple the second resistor to the second input terminal of the differential amplifier according to the third data strobe signal, the fourth data strobe signal, and the noise-suppression control signal.

3. The method of claim 2, wherein in response to the mode register setting value being greater than a specific value, the noise-suppression control signal generated by the noise-suppression control circuit is in a high low logic, and in response to the mode register setting value being equal to or less than the specific value, the noise-suppression control signal generated by the noise-suppression control circuit is in a low logic state.

* * * * *